United States Patent
Wu et al.

(10) Patent No.: US 11,508,659 B2
(45) Date of Patent: Nov. 22, 2022

(54) INTERCONNECT STRUCTURE IN SEMICONDUCTOR DEVICE AND METHOD OF FORMING THE SAME

(71) Applicant: TAIWAN SEMICONDUCTOR MANUFACTURING COMPANY LTD., Hsinchu (TW)

(72) Inventors: Guo-Huei Wu, Tainan (TW); Shun-Li Chen, Tainan (TW); Hui-Zhong Zhuang, Kaohsiung (TW); Chih-Liang Chen, Hsinchu (TW); Li-Chun Tien, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 58 days.

(21) Appl. No.: 17/017,596

(22) Filed: Sep. 10, 2020

(65) Prior Publication Data

US 2022/0077059 A1    Mar. 10, 2022

(51) Int. Cl.
*H01L 23/528* (2006.01)
*H01L 23/522* (2006.01)
*H01L 23/535* (2006.01)
*H01L 21/768* (2006.01)

(52) U.S. Cl.
CPC .... *H01L 23/5286* (2013.01); *H01L 21/76805* (2013.01); *H01L 21/76831* (2013.01); *H01L 21/76877* (2013.01); *H01L 21/76895* (2013.01); *H01L 23/5226* (2013.01); *H01L 23/535* (2013.01)

(58) Field of Classification Search
CPC ............. H01L 23/5286; H01L 23/5226; H01L 23/535
See application file for complete search history.

(56) References Cited

U.S. PATENT DOCUMENTS

2005/0161706 A1\* 7/2005 Sutardja ................ H01L 27/092
257/E23.102
2020/0395354 A1\* 12/2020 Lee ........................ G06F 30/394

\* cited by examiner

*Primary Examiner* — Farun Lu
(74) *Attorney, Agent, or Firm* — WPAT Law; Anthony King

(57) ABSTRACT

A semiconductor device includes a gate electrode extending in a first direction in a first layer over an active region, a first conductive line extending in the first layer adjacent to the gate electrode, a first power rail extending in a second direction perpendicular to the first direction in a second layer over the first layer, a second conductive line arranged in a third layer over the second layer, and a conductive via extending through the first power rail and electrically connecting the second conductive line to one of the gate electrode and the first conductive line. The conductive via is electrically insulated from the first power rail.

20 Claims, 20 Drawing Sheets

100B

INTERCONNECT STRUCTURE IN SEMICONDUCTOR DEVICE AND METHOD OF FORMING THE SAME

BACKGROUND

Electronic equipment involving semiconductor devices is essential for many modern applications. Technological advances in materials and design have produced generations of semiconductor devices, in which each generation includes smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductor devices. The manufacturing of a semiconductor device becomes more complicated in a miniaturized scale, and the increase in complexity of manufacturing may cause deficiencies such as high yield loss, reduced reliability of electrical interconnection and low testing coverage. Therefore, there is a continuous need to modify the structure and manufacturing method of the semiconductor devices in order to improve device robustness as well as reduce manufacturing cost and processing time.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
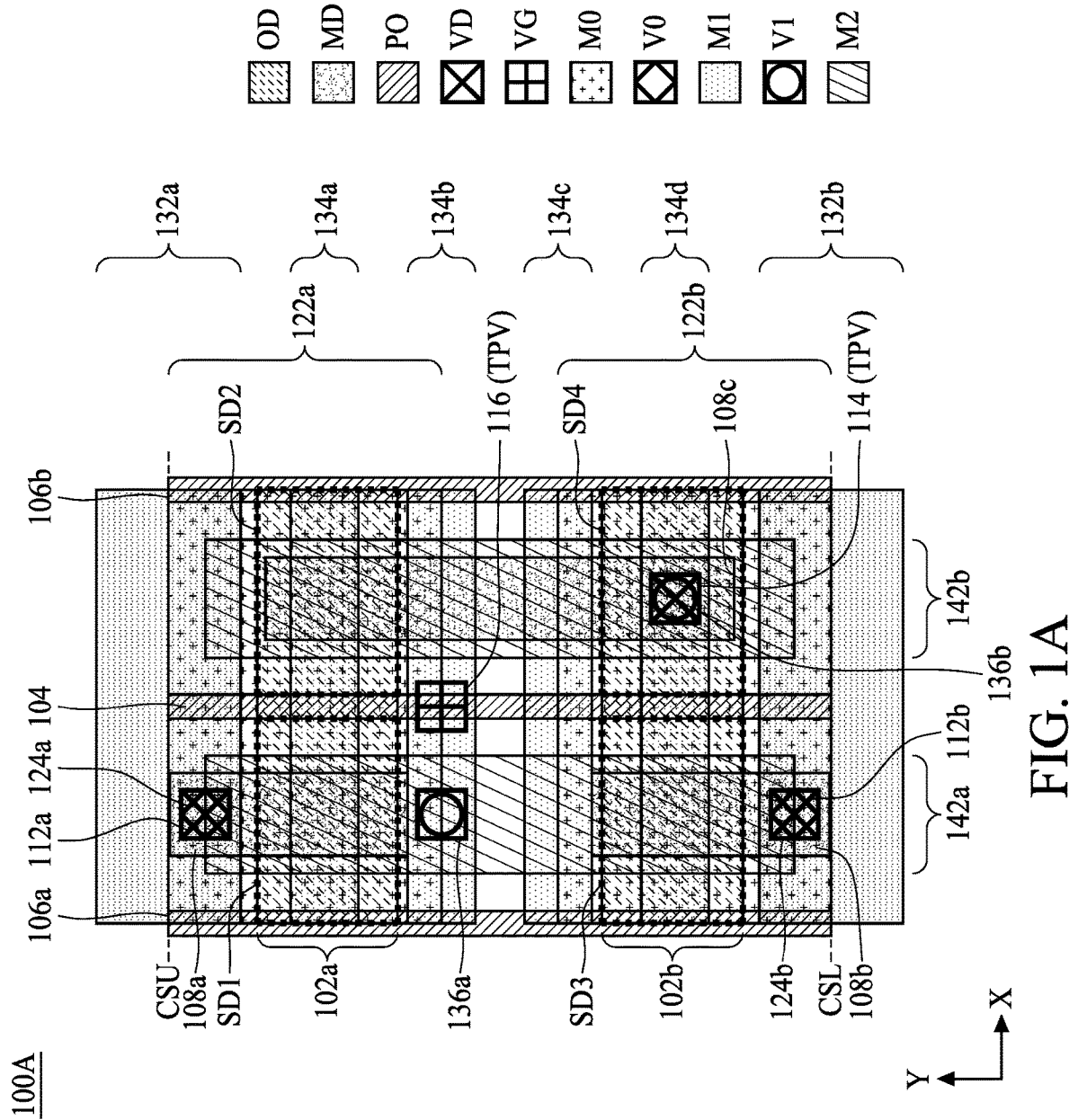
FIG. 1A is a design layout of a cell, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The term "standard cell" or "cell" used throughout the present disclosure refers to a group of circuit patterns in a design layout to implement specific functionalities of a circuit. A standard cell is comprised of one or more layers, and each layer includes various patterns expressed as unions of polygons. A design layout may be initially constructed by a combination of identical or different standard cells. The cells are interconnected using a routing structure. The geometries of the patterns in the cells may be adjusted at different stages of layout design in order to compensate for design and process effects. A standard cell may cover circuits corresponding to a portion or an entirety of a die to be manufactured. The standard cells may be accessible from cell libraries provided by semiconductor manufacturers or designers. In some embodiments, the standard cells are included in a standard cell library, which may be stored in a non-transitory computer-readable storage medium and accessed by a processor in various circuit design stages.

Embodiments of the present disclosure discuss structures and forming methods of the interconnect structure for reducing electro-migration (EM) and voltage drop. A conductive line layer in the interconnect structure, which may be a layer closest to the substrate among all of the layers, is configured as a power layer or a power plane in which all of the conductive lines are configured as power rails to convey power. As such, the line widths of the power rails in the power layer can be increased to reduce resistance and voltage drop. Further, a through-power via (TPV) structure is proposed to electrically couple the features in the substrate to the layers of the interconnect structure above the power layer. The through-power via is configured to convey data signals and is electrically insulated from the power rails in the power layer. Throughout the present disclosure, if multiple features of a similar type are shown, they are labeled by the same three-digit numerals along with different lower-case letters. For example, the features 102a and 102b refer to two instances of an active region in a semiconductor device, in which the active region 102a and 102b may have the same or different configurations, such as dimension and conductivity type. If a feature is referred to by the three-digit numeral only, it is intended to mean the union set of such features, e.g., e.g., the label 102 refers to the active regions collectively and includes the active regions 102a and 102b.

FIG. 1A is a design layout of a cell 100A, in accordance with some embodiments of the present disclosure. In some embodiments, the cell 100A is used for manufacturing an electronic circuit, such as an inverter gate. Although the proposed interconnect structure is used in the inverter gate in the present example, it is also applicable to other types of electronic circuits, such as a NAND gate, an XOR gate, an AND gate, a NOR gate, an AND-OR-Invertor (AOI) gate, or other suitable logic gate devices.

Referring to FIG. 1A, the cell 100A includes multiple layers overlaid with one another along with various patterns in the respective layers from a top-view perspective. The features of the cell 100A include active regions (OD) 102, a gate electrode 104, cell-edge gate electrodes 106, gate-layer conductive lines (MD) 108, power rails 122 and 132, conductive lines 134 and 142, and conductive vias 112, 114, 116, 124 and 136.

Figure 1B:
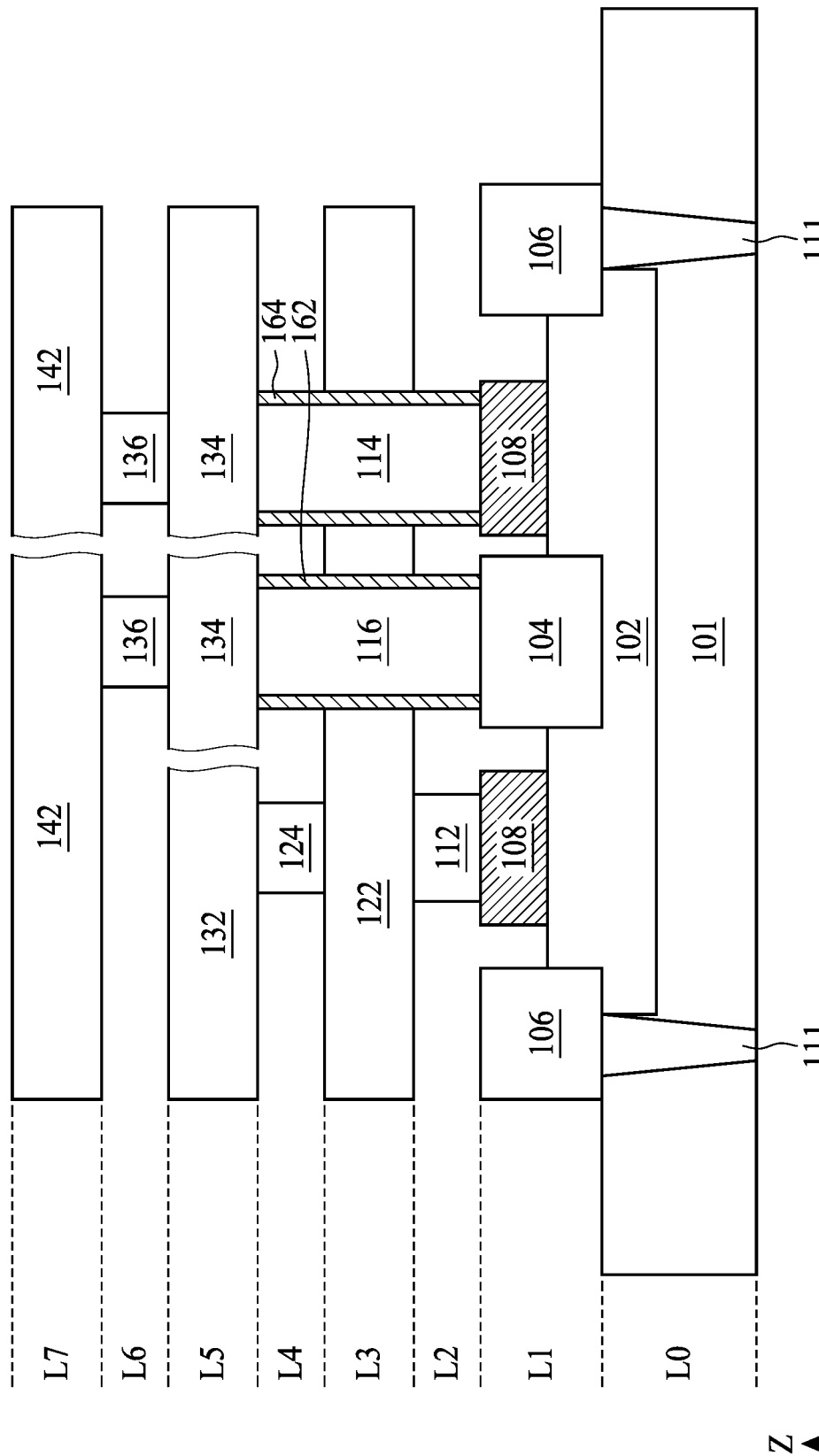
FIG. 1B is a cross-sectional view showing a vertical layer arrangement of the cell shown in FIG. 1A, in accordance with some embodiments of the present disclosure.

FIG. 1B is a cross-sectional view 100B showing a vertical arrangement of exemplary features in the respective layers of the cell 100A, in accordance with some embodiments of the present disclosure.

Referring to FIG. 1B, a substrate layer L0 is formed or provided. The substrate layer includes a substrate 101, which may be formed of a silicon substrate or other suitable semiconductor substrate. An active region 102 is arranged in the substrate 101 and exposed through an upper surface of the substrate 101. Although not separately shown, the active region 102 may include a first source/drain region, a second source/drain region and a channel region interposed between the two source/drain regions. The source/drain regions in the active region 102 may be an N-type active region doped with N-type impurities such as arsenic, phosphorus, or the like, or a P-type active region doped with P-type impurities such as boron or the like. The channel region in the active region 102 may be undoped or lightly doped. In the depicted embodiment, a raised active region 102 is implemented for a planar or fin-type field-effect transistor (FinFET) device, in which the source/drain regions may have an upper surface higher than the upper surface of the substrate 101 and protrude into a gate layer L1 over the substrate layer L0. In some embodiments, the substrate layer L0 further includes isolation structures in the substrate 101 to define and laterally surround the active region 102. In some embodiments, the isolation structures 111 are formed of dielectric materials, such as oxide or nitride, and may be referred to as shallow trench isolation (STI).

A gate electrode 104 is provided in the gate layer L1 over the active region 102. The gate electrode 104 may be formed of a conductive material, such as doped polysilicon or formed of a metal gate comprising metallic materials such as tungsten, and cobalt, and other work function adjusting metals, such as Ti, Al, TiAl, TiN, TaC, and the like. Further, a gate-layer conductive line 108 is also provided in the gate layer L1 over the active region 102 adjacent to the gate electrode 104. Although not explicitly shown in FIG. 1B, a gate dielectric film formed of dielectric materials may be arranged between the channel region and the gate electrode 104.

An interconnect structure is provided over the gate layer L1 and includes a plurality of conductive line layers, e.g., layers L3, L5 and L7, and a plurality of conductive via layers, e.g., layers L2, L4 and L6. Each of the conductive line layers L3, L5 and L7 includes a plurality of parallel conductive lines, e.g., the conductive lines 122, 132, 134 and 142, and each of the conductive via layers L2, L4 and L6 includes at least one conductive via, e.g., the conductive vias 112, 114, 116, 124 and 136. These conductive lines (including the gate-layer conductive line 108) of the conductive line layers and the conductive vias of the conductive via layers may be formed of conductive materials, such as copper, tungsten, aluminum, titanium, tantalum, titanium nitride, tantalum nitride, alloys thereof, or the like.

The aforementioned conductive line layers L3, L5 and L7 may be electrically interconnected through the conductive vias 112, 114, 116, 124 and 136 in various ways. A first type interconnection connects two conductive lines in adjacent conductive line layers through a conductive via in the intervening conductive via layer. For example, the conductive lines 108 and 122 are electrically connected through the conductive via 112, and conductive lines 122 and 132 are electrically connected through the conductive via 124.

A second type interconnection adopts a conductive via that extends beyond one conductive via layer. For example, the conductive vias 114 and 116 run across the conductive via layer L2, the conductive line layer L3 and the conductive via layer L4. Since the conductive line layer L5 is referred to as a power layer or power plane, the conductive vias 114 and 116 are referred to as through-power via (TPV) throughout the present disclosure. The central conductive line 134 in the conductive line layer L3 and the gate electrode 104 are electrically connected through the conductive via 116, which runs through and electrically insulated from the conductive line 122. The conductive line 122 may be insulated from the conductive via 116 by a spacer layer 162. The right conductive line 134 in the conductive line layer L3 and the right conductive line 108 are electrically connected through the conductive via 114, which runs through and electrically insulated from the conductive line 122. The conductive line 122 may be insulated from the conductive via 114 by a spacer layer 164. The numbers and materials of the conductive lines and conductive vias shown in FIG. 1B are for illustrative purposes only. Other numbers, materials and configurations of the layers shown in FIG. 1B are within the contemplated scope of the present disclosure.

In some embodiments, the spacer layers 162 and 164 have straight sidewalls from near the gate electrode 104 or the gate-layer conductive line 108 in the gate layer L1 to near the conductive line 134 in the layer L5. In some embodiments, the spacer layer 162 or 164 has an inclined sidewall such that the conductive via 114 or 116 tapers from near the conductive line 134 in the layer L5 to near the gate electrode 104 or the gate-layer conductive line 108 in the gate layer L1.

Referring to FIG. 1A, in the cell 100A, two active regions (OD) 102a and 102b are arranged in the substrate layer L0. The active regions 102a and 102b may extend in a row direction along the x-axis. In some embodiments, the active regions 102a and 102b are a P-type active region and an N-type active region, respectively. However, in other embodiments, the active regions 102a and 102b are an N-type active region and a P-type active region, respectively. The active regions 102a and 102b are defined and separated from each other by isolation structures 111 (not separately shown in FIG. 1A).

The gate electrode (GT) 104 is disposed in the gate layer L1 over the active regions 102a and 102b. The gate electrode 104 extends in a column direction along the y-axis perpendicular to the x-axis. In some embodiments, the gate electrode 104 serves as a functional gate electrode in forming a FET device.

The cell 100A further includes two cell-edge gate electrodes 106, i.e., 106a and 106b, in the gate layer L1 that extend in the column direction on a left cell side and a right cell side, respectively, of the cell 100A. The cell-edge gate electrodes 106 are parallel to the gate electrode 104. In some embodiments, the cell-edge gate electrodes 106 are formed of a material the same as or different from that of the gate electrode 104, and do not serve any functions in forming a FET device.

Source/drain regions SD1 and SD2 are formed in the active region 102a and delimited by the gate electrode 104 and the cell-edge gate electrodes 106, in which the source/drain regions SD1 and SD2 correspond to the source region and drain region, respectively, of a P-type FET device of the invertor. The active region 102a covered by the gate electrode 104 between the source/drain regions SD1 and SD2 is defined as the channel region of the P-type FET device. Similarly, Source/drain regions SD3 and SD4 are formed in the active region 102b and delimited by the gate electrode 104 and the cell-edge gate electrodes 206, in which the source/drain regions SD3 and SD4 correspond to the source region and drain region, respectively, of an N-type FET device of the inverter. The active region 102b covered by the gate electrode 104 between the source/drain regions SD3 and SD4 is defined as the channel region of the N-type FET device.

The gate-layer conductive lines (MD) 108 are arranged in the gate layer L1. The gate-layer conductive lines 108 are arranged parallel to the gate electrodes 104. For example, gate-layer conductive lines 108a and 108b are arranged overlapping the source/drain regions SD1 and SD3, respectively, and a gate-layer conductive line 208c is arranged overlapping the source/drain regions SD2 and SD4. Referring to FIGS. 1A and 1B, the gate-layer conductive line 108a extends over and is electrically connected to the source/drain region SD1, and the gate-layer conductive line 108b extends over and is electrically connected to the source/drain region SD3. The gate-layer conductive line 108c extends over the source/drain regions SD2 and SD4 and electrically connects the source/drain region SD2 to the source/drain region SD4.

The power rails (M0) 222 are arranged in the conductive line layer L3 and extending in the row direction. The power rails 222, which includes power rails 222a and 222b are arranged in parallel on an upper cell side CSU and a lower cell side CSL, respectively, of the cell 100A. In some embodiments, the power rails 222a and 222b are configured to supply a first voltage VDD and a second voltage VSS, respectively. In some embodiments, the first voltage VDD is a positive voltage and the second voltage VSS is ground.

In some embodiments, the power rails 122a and 122b are arranged immediately adjacent to each other without any data rail therebetween, in which the data rails are configured to convey data signals. In some embodiments, the conductive line layer L3 is configured to arrange only power rails, e.g., power rails 222, configured to convey power instead of conductive lines serving as data rails. None of the conductive lines in the conductive line layer L3 is provided for conveying data. In other words, the conductive line layer L3 is configured as a power layer or power plane.

The conductive lines (M1) 132 and 134 are arranged in the conductive line layer L5 and extending in the row direction. In some examples, the conductive lines 132 are configured as power rails while the conductive lines 132 are configured as data rails. The power rails 132, which include power rails 132a and 132b are arranged in parallel on the upper cell side CSU and the lower cell side CSL, respectively, of the cell 100A. In some embodiments, the power rails 132a and 132b are configured to supply the first voltage VDD and the second voltage VSS, respectively. In some embodiments, the conductive lines 134a, 134b, 134c and 134d are arranged between the power rails 132a and 132b.

The conductive lines (M2) 142 are arranged in the conductive line layer L7 and extending in the column direction. In the depicted example, the conductive lines 142, such as conductive lines 142a and 142b, are configured as data rails. However, one or more of conductive lines 142 may be configured as power rails in other examples.

In the present example, the conductive lines 142a and 142b are configured as an input pin and an output pin, respectively, of the cell 100A, in which the conductive line 142a is configured to transmit an input signal to the gate electrode 104 and the conductive line 142b is configured to receive an output signal from the source/drain region SD2 or SD4. Referring to FIGS. 1A and 1B, the conductive line 142a is electrically connected to the gate electrode 104 through a conductive via 136a in the conductive via layer L6, the conductive line 134b in the conductive line layer L5, and the conductive via 116, in which the conductive via 116 runs through the layers L4, L3 and L2 and into the gate layer L1. Similarly, the conductive line 142b is electrically connected to the source/drain region SD2 or SD4 through a conductive via 136b in the conductive via layer L6, the conductive line 134d in the conductive line layer L5, the conductive via 114 and the gate-layer conductive line 108c in the gate layer L1, in which the conductive via 114 runs through the layers L4, L3 and L2.

A first biasing path of the cell 100A for supplying the first voltage VDD is formed between the power rail 132a and the source/drain region SD1 through a conductive vias 124*a* in the conductive via layer L4, the power rail 122*a* in the conductive line layer L3, a conductive via 112*a* arranged in the conductive via layer L2 and directly over the source/drain region SD1, and the gate-layer conductive line 108*a* in the gate layer L1.

A second biasing path of the cell 100A for supplying the second voltage VSS is formed between the power rail 132*b* and the source/drain region SD3 through a conductive vias 124*b* in the conductive via layer L4, the power rail 122*b* in the conductive line layer L3, a conductive via 112*b* arranged in the conductive via layer L2 and directly over the source/drain region SD3, and the gate-layer conductive line 108*b* in the gate layer L1.

Figure 1C:
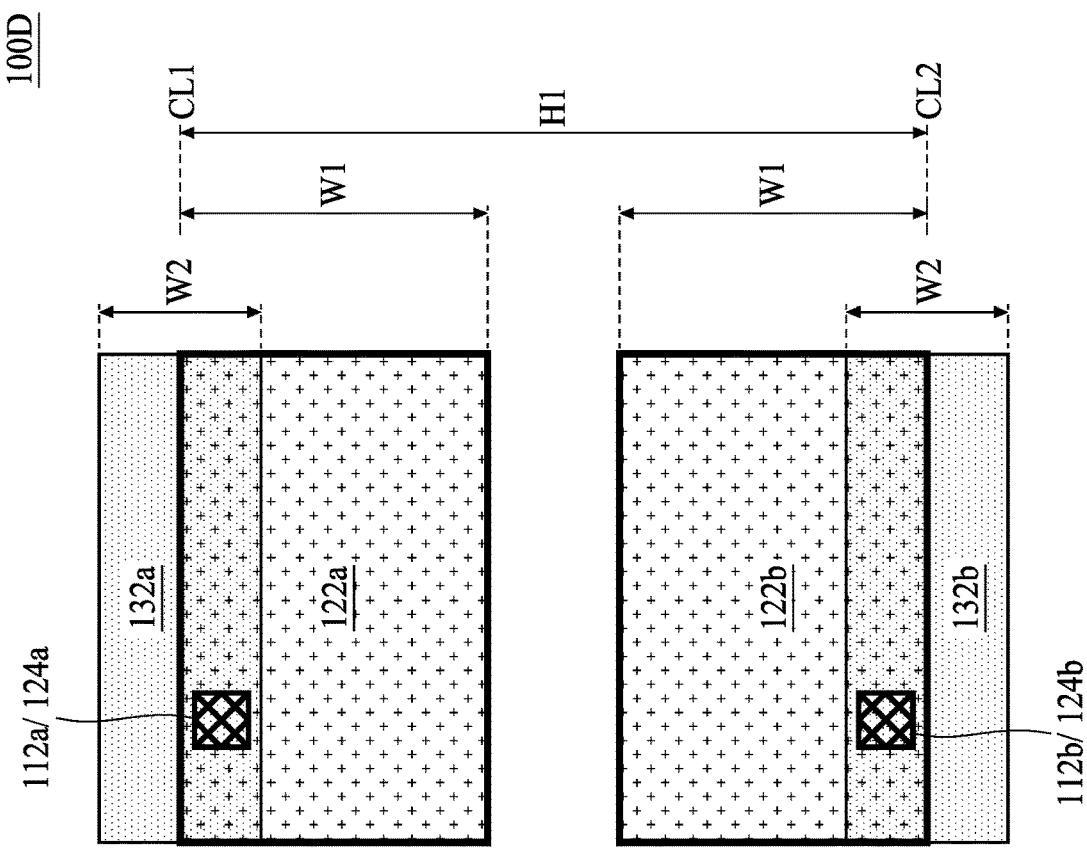
FIG. 1C is another plan view of the cell shown in FIG. 1A, in accordance with some embodiments of the present disclosure.
Figure 1C:
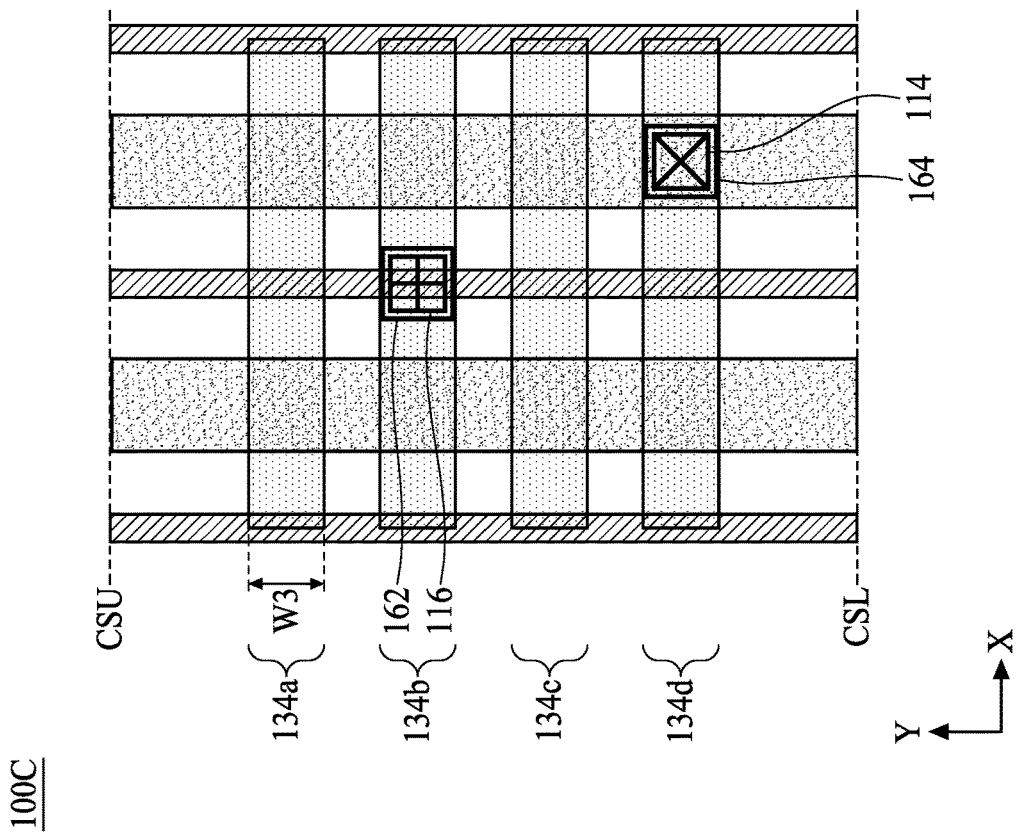

FIG. 1C shows plots 100C and 100D of simplified plan views of the cell 100A shown in FIG. 1A, in accordance with some embodiments of the present disclosure. Only portions of the features in one or more layers of the cell 100A are illustrated in the plots 100C and 100D for clarity. The plot 100C at the left-hand side of FIG. 1C illustrates that conductive vias 114 and 116 are formed to overlap the conductive lines 134*d* and 134*b*, respectively. The spacer layer 164 and 162 at least partially laterally surround the conductive via 114 and 116, respectively and electrically insulating the conductive vias 114 and 116 from the conductive lines 134*d* and 134*b*, respectively.

The plot 100D at the right-hand side of FIG. 1C illustrates that conductive vias 112*a* and 124*a*, which are formed in the conductive via layer L2 and L4, respectively, are arranged to overlap the conductive lines 122*a* and 132*a*, while conductive vias 112*b* and 124*b*, which are formed in the conductive via layer L2 and L4, respectively, are arranged to overlap the conductive lines 122*b* and 132*b*.

Referring to FIG. 1C, a cell height H1 of the cell 100A is defined as a distance between the upper cell side CSU and the lower cell side CSL of the cell 100A. In some embodiments, an upper side of the power rail 122*a* is aligned with the upper cell side CSU and a lower side of the power rail 122*b* is aligned with the lower cell side CSL. In some embodiments, the power rails 122*a* and 122*b* have substantially equal widths W1 in the column direction between their respective upper sides and lower sides. In some embodiments, a ratio between the width W1 and the cell height H1 is in a range between about 0.2 and about 0.8, or between about 0.5 and about 0.7. In some embodiments, the width W1 is equal to or greater than a width of the active region 102*a* or 102*b* measured in the column direction.

In some embodiments, a centerline CL1 of the power rail 132*a* is aligned with the upper cell side CSU and a centerline CL2 of the power rail 132*b* is aligned with the lower cell side CSL. In some embodiments, the power rails 132*a* and 132*b* have substantially equal widths W2 in the column direction. In some embodiments, a ratio between the width W2 and width W1 is in a range between about 0.1 and about 0.4, or between about 0.2 and about 0.3. In some embodiments, the width W1 is greater than twice the width W2, or greater than three times the width W1.

The conductive lines 134 have substantially equal widths W3 in the column direction. In some embodiments, a ratio between the width W3 and width W1 is in a range between about 0.03 and about 0.2, or between about 0.07 and about 0.15. In some embodiments, the conductive lines 134 are equally spaced between the power rails 132*a* and 132*b*. Although not separately shown, the conductive lines 134 may be arranged to align with predetermined hypothetic horizontal lines, referred to as horizontal tracks, within the cell 100A. The horizontal tracks are usually set as equally spaced and thus the conductive lines 134 are equally spaced accordingly. In some embodiments, the cell height H1 of the cell 100A is determined according to a total number of the conductive lines 134 accommodated within the cell 100A. As shown in FIGS. 1A and 1C, in the depicted embodiment, the cell height H1 is less than about 150 nm, or less than about 130 nm, e.g., about 110 nm, in which the number of conductive lines 134 is four.

Existing routing structures arrange the power rails in the midst of the conductive lines in a same conductive line layer for ease of distributing power to the locations where necessary. However, as the device size continues to shrink, either the number of conductive lines (including the power rails) or their line widths are required to be reduced. As a result, the power transmission efficiency of the power rails is degraded by their reduced width or number, thereby the voltage drop and electro-migration (EM) effects are made worsen. In order to resolve the issue of area shortage for the power rail, it is proposed herein to configure a power layer in the first conductive line layer, e.g., the conductive line layer L3 in FIG. 1A over the substrate layer L0, in which the power rails 122 can be made as wide as possible. Furthermore, the data rails are arranged in layers higher than the power layer, and the data signals are propagated through the through-power vias extending through the power layer, i.e., the conductive line layer L3, as illustrated in FIG. 1B. The advantage is that the cell height H1 can be further reduced while keeping the power transmission efficiency. The device size can be decreased further without sacrificing the electrical performance of the electronic device.

Figure 1D:
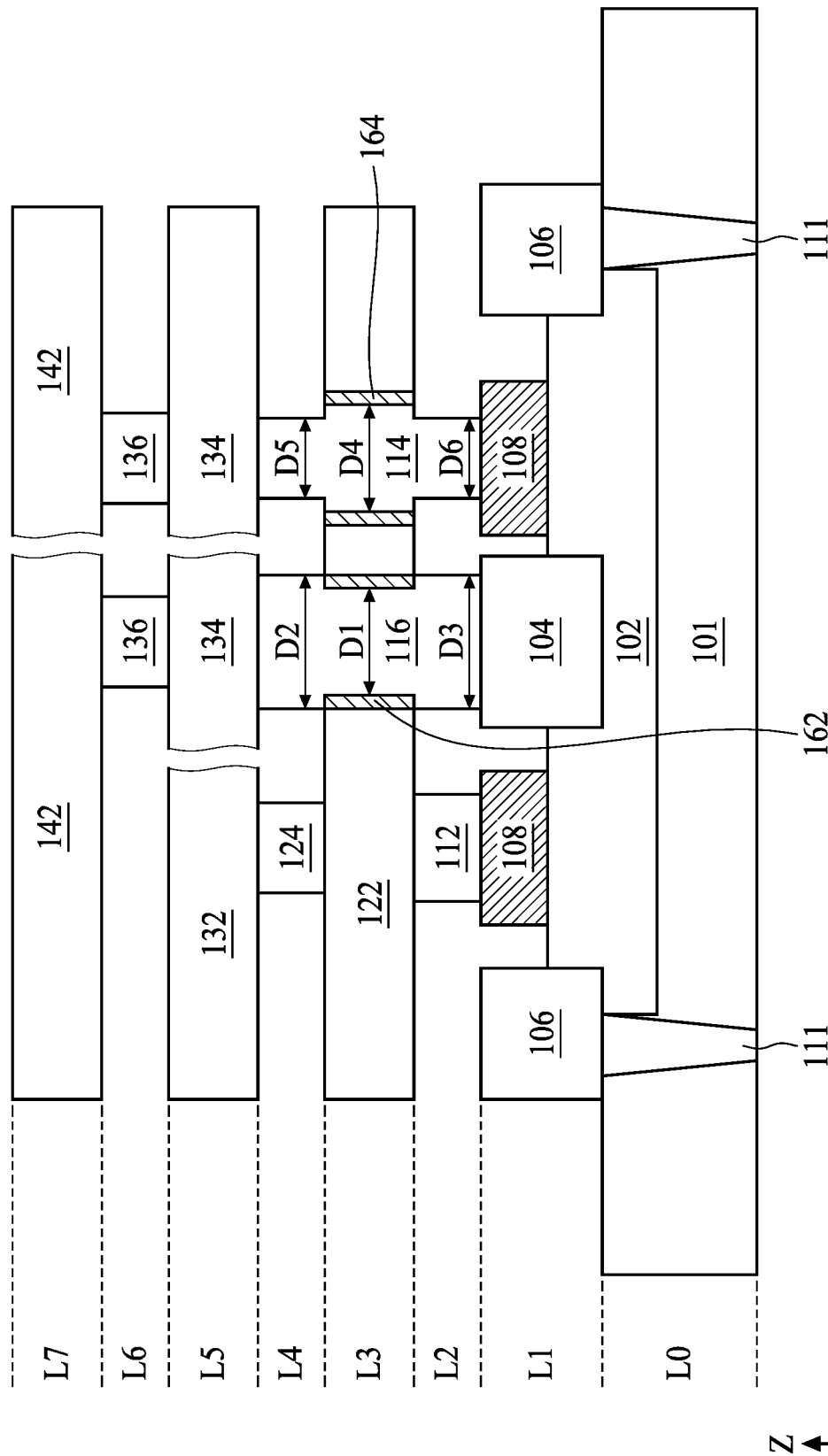
FIG. 1D is a cross-sectional view showing a vertical layer arrangement of the cell shown in FIG. 1A, in accordance with some embodiments of the present disclosure.

FIG. 1D is a cross-sectional view showing a vertical layer arrangement of the semiconductor device shown in FIG. 1A, in accordance with some embodiments of the present disclosure. Referring to FIG. 1B and FIG. 1D, the spacer layers 162 and 164 shown in FIG. 1B extend from near the gate electrode 104 or the gate-layer conductive line 108 in the gate layer L1 to near the conductive line 134 in the layer L5. In contrast, the spacer layer 162 or 164 shown in FIG. 1D at least partially laterally surrounds the power rail 122 and has a height substantially equal to the thickness of the power rail 122 along the vertical direction in the z-axis.

In some embodiments as shown in FIG. 1D, the conductive via 116 or 114 has different segments with different widths. For example, the conductive via 116 or 114 has a width D1 or D4 at the elevation of the power rail 122 in the layer L3 different from a width D2, D3, D5 or D6 at the elevation of the layer L2 or L4. In some embodiments, the width D1 is equal to or greater than the widths D2 and D3; however, the width D1 may be alternatively less than the widths D2 and D3 in other embodiments. In some embodiments, the width D4 is equal to or less than the widths D5 and D6; however, the width D4 may be alternatively greater than the width D5 and D6 in other embodiments.

Figure 2:
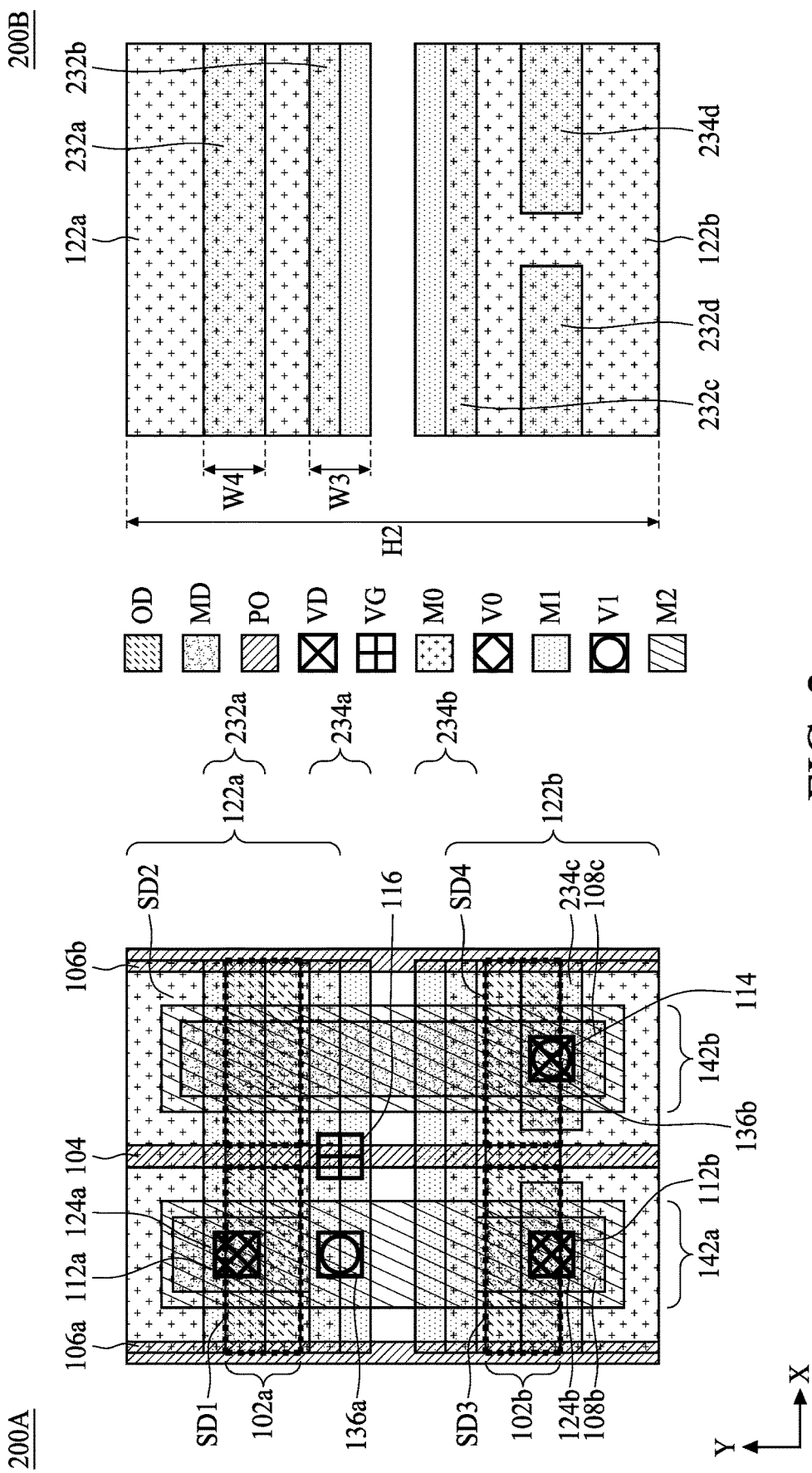
FIG. 2 is a design layout of a cell, in accordance with some embodiments of the present disclosure.

FIG. 2 illustrates a design layout of a cell 200A, in accordance with some embodiments of the present disclosure. The cell 200A is similar to the cell 100A in many aspects, and thus descriptions of these aspects are not repeated for brevity. Referring to FIG. 1A and FIG. 2, the cell 100A differs from the cell 200A in the configurations of the power rails 134*a* and 134*b* in the conductive line layer L5. FIG. 2 also shows a plot 200B, in which only the layout of the conductive line layer L5 of the cell 200A are shown for clarity. As seen from the plot 200B, the cell 200A includes power rails 232*a* and 232*b* and conductive lines 234*b*, 234*c* and 234*d*.

The power rails 232 have a width W4, which is substantially equal to the width W3 of the conductive lines 234 of the cell 200A and the width W3 of the conductive lines 134 of the cell 100A. The width W4 is less than the width W2 of the power rails 132 in the cell 100A. Further, the conductive lines 234 are arranged to align with the horizontal tracks in a manner similar to the alignments of the conductive lines 134 with the horizontal tracks. As seen in FIG. 2, the power rail 232a or 232b are moved to be closer to the center of the cell 200A than the power rails 132. The power rail 232a and 232b are arranged aligned with one of the horizontal tracks for the conductive lines 234, and thus aligned with one of the conductive lines 234 in the row direction. The power rail 232a takes the place of the conductive line 134a, and the power rail 232b occupies a portion of the conductive line 134d. The conductive line 234d has a length less than that of the conductive line 134d due to the presence of the power rail 232b. line In some embodiments, the entire power rail 232a or 232b overlaps the power rail 122a or 122b, respectively, from a top-view perspective. In some embodiments, the power rail 232a has a length in the row direction substantially equal to the length of the power rail 122a in the row direction, while the power rail 232b has a length in the row direction less than the length of the power rail 122a or 122b in the row direction due to the presence of the conductive line 234c.

In adaptation to the modification of the power rail 232a, the first biasing path of the cell 200A for supplying the first voltage VDD is formed between the power rail 232a and the source/drain region SD1 through the conductive vias 124a in the conductive via layer L4, the power rail 122a in the conductive line layer L3, the conductive via 112a arranged in the conductive via layer L2 and directly over the source/drain region SD1, and the gate-layer conductive line 108a in the gate layer L1.

In adaptation to the modification of the power rail 232b, the second biasing path of the cell 200A for supplying the second voltage VSS is formed between the power rail 232b and the source/drain region SD3 through the conductive vias 124b in the conductive via layer L4, the power rail 122b in the conductive line layer L3, the conductive via 112b arranged in the conductive via layer L2 and directly over the source/drain region SD2, and the gate-layer conductive line 108b in the gate layer L1.

The cell 200A has a cell height H2 defined by an upper cell side CSU and a lower cell side CSL. Since the power rails 232 are moved toward the center of the cell 200A, the resultant cell height H2 is less than the cell height H1. In some embodiments, the cell height H1 is in a range of about 0.6 and about 0.9, or between about 0.7 and about 0.9, of the cell height H1.

Referring to FIG. 1A and FIG. 2, the power rails 132 provides advantages of reduced resistance due to their greater conduction areas as compared to the power rails 232. The power rails 232 provides the advantages of a reduced cell height, which may help decrease the form factor of the semiconductor device and allow greater flexibility of power rail allocation. The area optimization for the power rails 232 and the conductive line 234 can be achieved more easily under the configuration of the cell 200A.

Figure 3A:
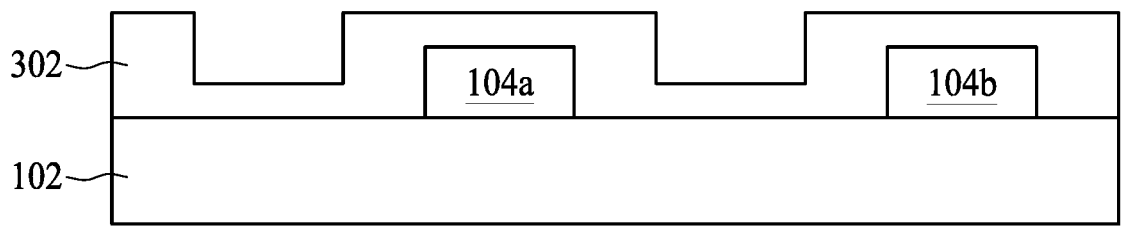
FIGS. 3A to 3O are cross-sectional views of intermediate stages of a method of manufacturing a semiconductor device, in accordance with some embodiments of the present disclosure.
Figure 3B:
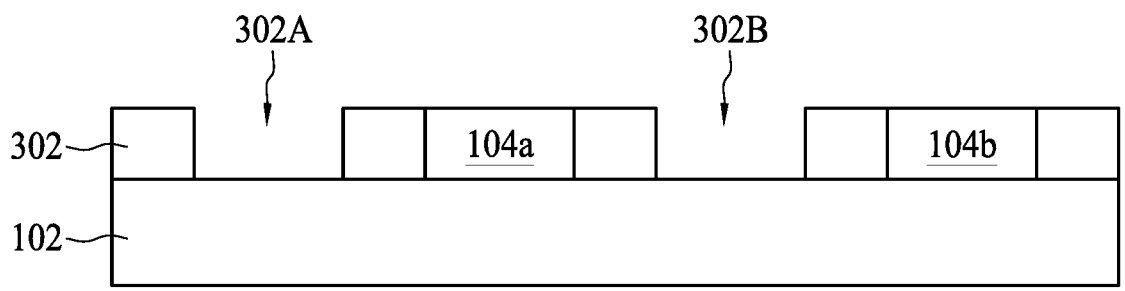
Figure 3C:
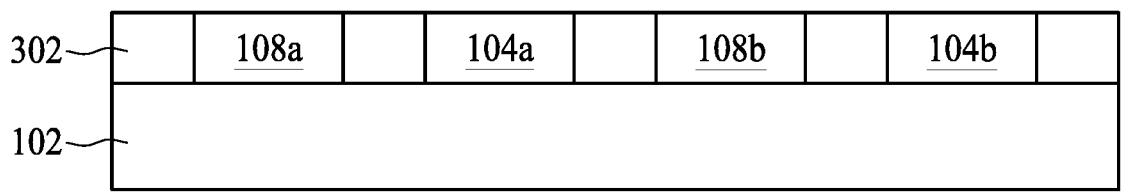
Figure 3D:
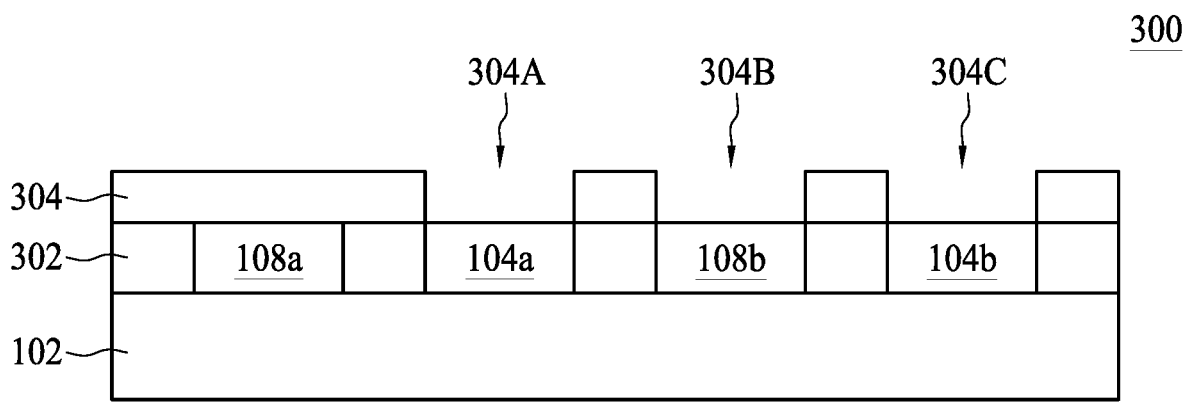
Figure 3E:
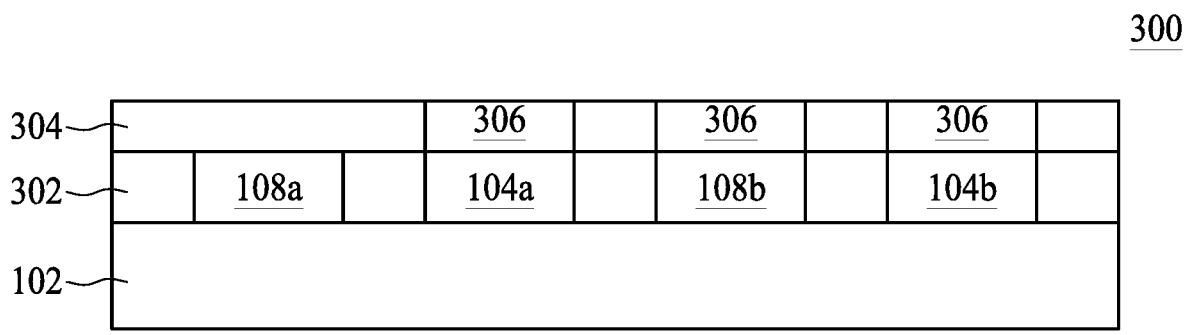
Figure 3F:
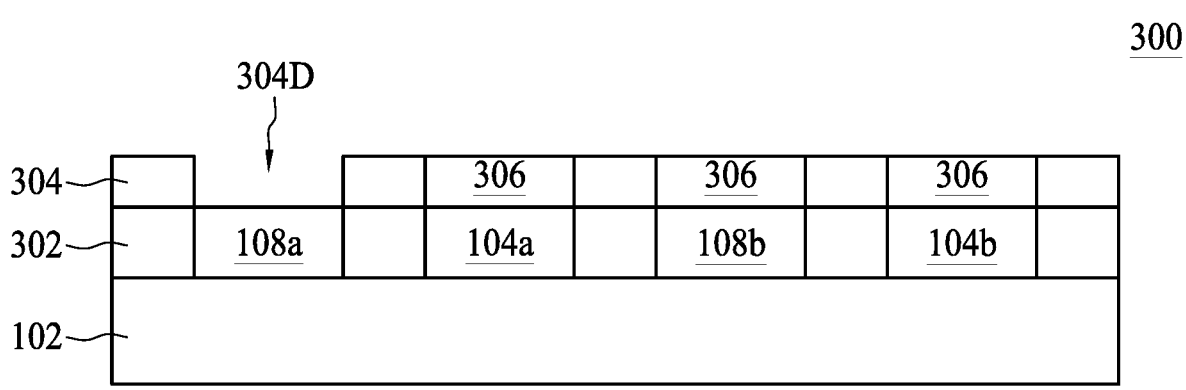
Figure 3G:
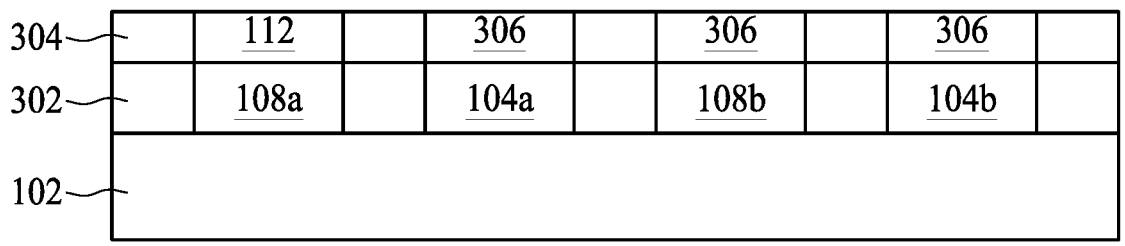
Figure 3H:
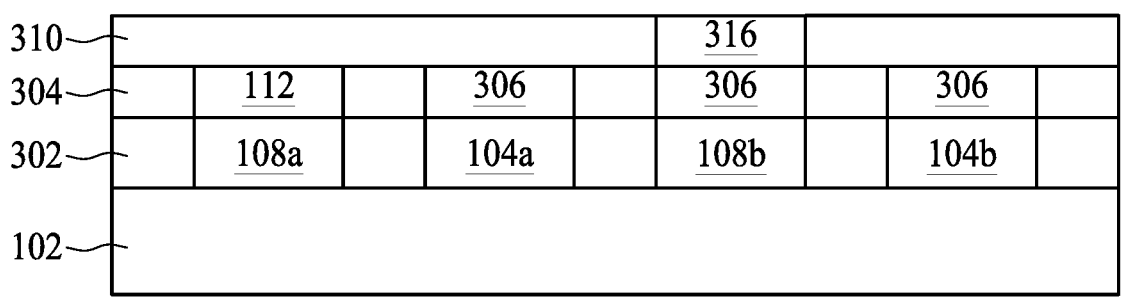
Figure 3I:
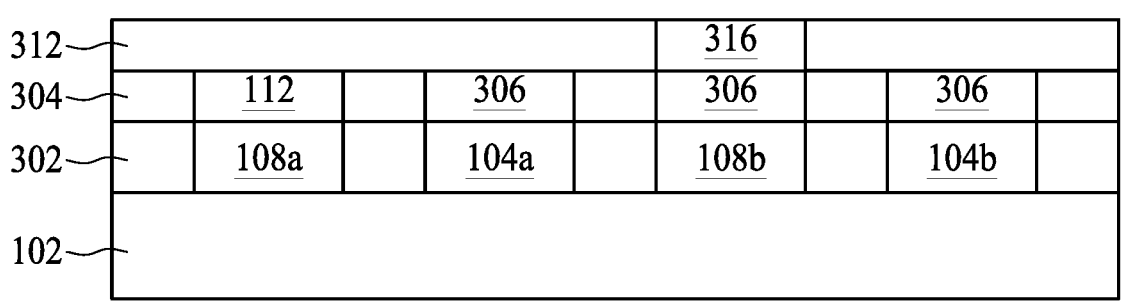
Figure 3J:
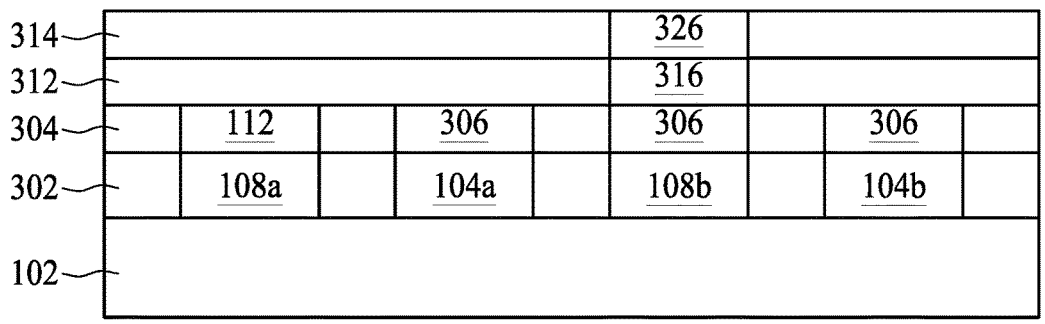
Figure 3K:
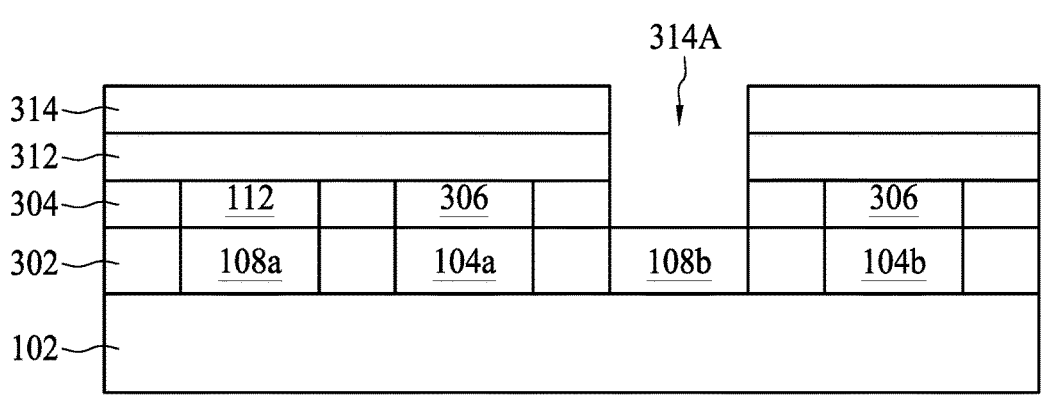
Figure 3L:
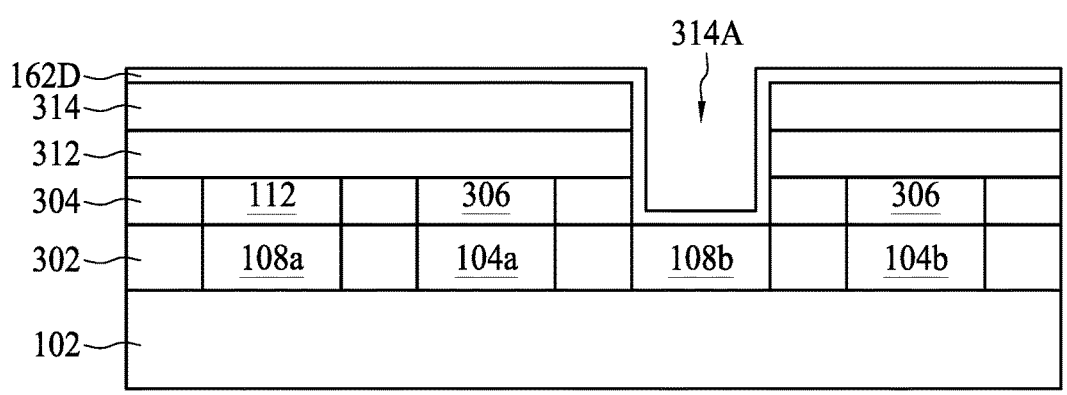
Figure 3M:
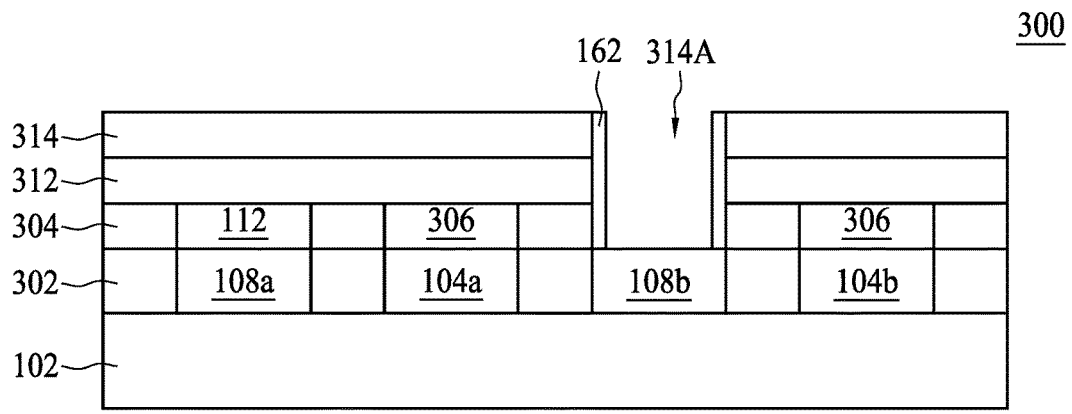
Figure 3N:
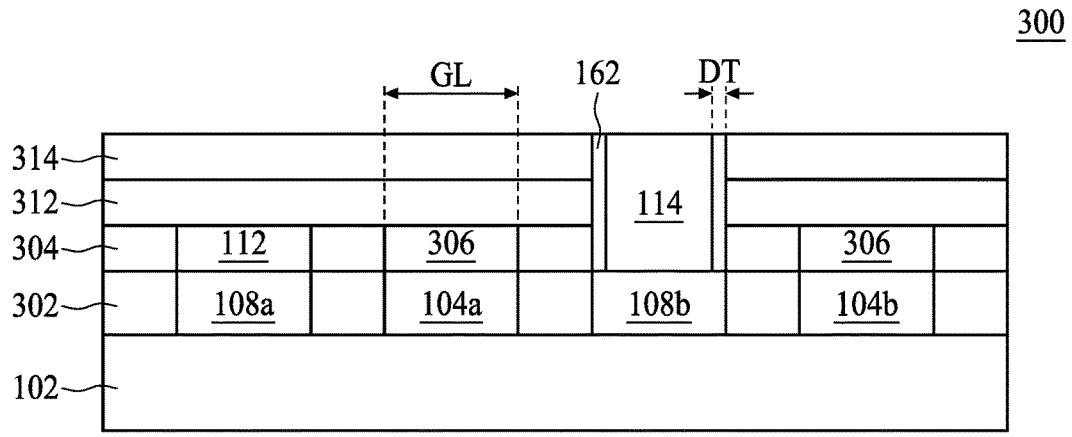
Figure 3O:
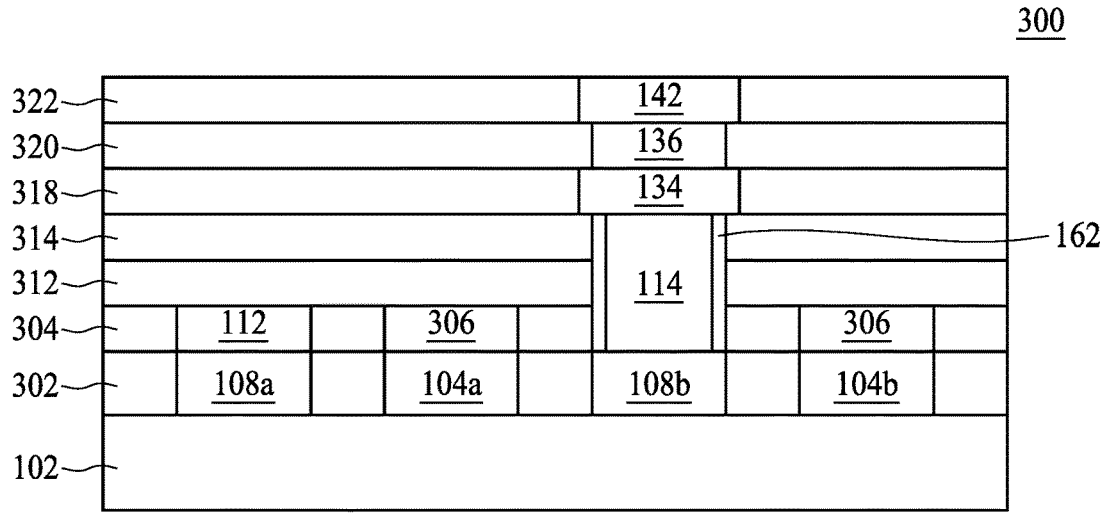

FIGS. 3A to 3O are cross-sectional views of intermediate stages of a method of manufacturing a semiconductor device 300, in accordance with some embodiments of the present disclosure. The semiconductor device 300 is manufactured in accordance with the design layout of the cell 100A or 200A. It should be understood that additional steps can be provided before, during, and after the steps shown in FIGS. 3A to 3O, and some of the steps described below can be replaced or eliminated in other embodiments. The order of the steps may be interchangeable.

Referring to FIG. 3A, a substrate (not separately shown) including an active region 102 is provided or formed. One or more gate electrodes 104 (including the gate electrodes 104a and 104b) are formed over the active region 102. In some embodiments, the active region 102 and the gate electrode 104 are formed as part of a FET device. The active region 102 may be P-type or N-type active region. In some embodiments, the active region 102 is implemented as a planar or raised active region in a planar FET device, or includes fin, nanowire or nanosheet structures in a FinFET device, a GAA FinFET device, or other suitable non-planar FET devices.

A dielectric layer 302 is deposited over the active region 102 and the gate electrodes 104. The dielectric layer 302 may be referred to as interlayer dielectric (ILD). The dielectric layer 302 may be formed of a dielectric material, such as oxide, nitride, oxynitride, carbide, or other suitable dielectric materials. The dielectric layer 302 may be formed by a deposition operation, such as spin coating, physical vapor deposition (PVD), chemical vapor deposition (CVD), plasma-enhanced CVD (PECVD), atomic layer deposition (ALD), or any other suitable process. In some embodiments, the dielectric layer 302 is formed on sidewalls and upper surfaces of the gate electrodes 104 in a conformal manner.

Referring to FIG. 3B, the dielectric layer 302 is patterned to expose portions of the upper surface of the active region 102. Two exemplary trenches 302A and 302B for the gate-layer conductive lines 108 are formed accordingly. The trenches 302A and 302B may expose source/drain regions, e.g., the source/drain region SD1 and SD3 shown in FIG. A, of the active region 102. The patterning of the dielectric layer 302 may be performed using photolithography and etching operations. The etching operation may be a dry etch, a wet etch, an ion reactive etch (RIE), or the like. In an exemplary etching operation, a dry etch is performed to remove horizontal portions of the dielectric layer 302 over the gate electrodes 104 and in the trenches 302A and 302B. The patterned dielectric layer 302 may expose the gate electrodes 104 and may have a planarized surface level with the gate electrodes 104.

FIG. 3C illustrates the formation of the gate-layer conductive line 108a and 108b. A conductive material, such as copper, tungsten, aluminum, titanium, tantalum, titanium nitride and tantalum nitride is formed in the trenches 302A and 302B. In some embodiments, the gate-layer conductive lines 108 may include a multilayer structure (not separately shown), such as including at least one of a seed layer, a diffusion barrier layer and a main metal layer. The gate-layer conductive lines 108a and 108b may be formed using CVD, PVD, ALD, electroplating, electroless plating, or other suitable processes. In some embodiments, excess materials of the gate-layer conductive lines 108 are formed over the upper surface of the active region 102 and the gate electrodes 104. In such situation, a planarization operation may be involved to remove the excess materials and level the upper surfaces of the gate-layer conductive lines 108. The planarization operation may include as mechanical grinding, chemical mechanical planarization (CMP) or other suitable operations.

Referring to FIG. 3D, a patterned dielectric layer 304 is formed over the gate electrodes 104 and the gate-layer conductive lines 108. Initially, a material of the dielectric layer 304 is deposited over the active region 102, the gate electrodes 104 and the gate-layer conductive lines 108, followed by a pattering operation. Trenches 304A, 304B are 304C are formed through the dielectric layer 304 and expose the gate electrodes 104a and 104b and the conductive line 108b. The material of the dielectric layer 304 may include oxide, nitride, oxynitride, carbide, or other dielectric materials. The deposition and patterning operations for the patterned dielectric layer 304 are similar to those of the dielectric layer 302.

FIGS. 3E to 3G illustrate the formation of a conducive via 112, e.g., the conductive via 112a or 112b shown in FIG. 1A, over the gate-layer conductive line 108a. Referring to FIG. 3E, mask regions 306 are formed in the trenches 304A, 304B and 304C. The mask regions 306 may be formed of a photoresist material or a dielectric material, such as nitride (e.g., silicon nitride) or other suitable dielectric materials. In an exemplary procedure, the mask regions 306 are formed by deposition a material of the mask regions 306 over the patterned dielectric layer 304, followed by removing the excess materials over the upper surface of the patterned dielectric layer 304 by a planarization operation.

Referring to FIG. 3F, a patterning operation is performed on the dielectric layer 304 to form a trench 304D exposing the gate-layer conductive line 108a. In some embodiments, a mask layer (not separately shown) is formed over the dielectric layer 304 and covers the mask regions 306. The mask layer defines the trench 304D directly over the gate electrode 104a. The mask layer may be formed of a photoresist material or a dielectric material, such as oxide, nitride, oxynitride or carbide. An etching operation, which may include a dry etch, a wet etch, an RIE, or the like, is performed to form the trench 304D using the mask layer as an etching mask. In some embodiments, the mask layer is removed or stripped of after the trench 304D is formed.

Subsequently, as shown in FIG. 3G, a conductive material is deposited in the trench 304D using, e.g., CVD, PVD, ALD, plating, or other suitable deposition operations to form the conductive via 112. A planarization operation, such as CMP, may be employed to level the upper surface of the patterned dielectric layer 304. The conductive via 112 may have a via height equal to the thickness of the dielectric layer 304.

Referring to FIG. 3H, a mask layer 310 is formed over the patterned dielectric layer 304, mask regions 306 and the conductive via 112. The mask layer 310 is patterned to form a trench over the mask region 306 directly above the gate-layer conductive line 108b. The material, configuration and method of forming for the patterned mask layer 310 are similar to those for the mask layer for forming the trench 304D described with reference to FIG. 3F.

A mask region 316 is formed in the trench defined by the patterned mask layer 310. The mask region 316 may be formed of a photoresist material or a dielectric material, such as oxide, nitride, oxynitride or carbide. In some embodiments, the mask region 316 includes a material similar to the mask region 306 and different from the mask layer 310.

FIG. 3I shows the formation of a conductive line 312. In some embodiments, the conductive line 312 corresponds to the power rail 122a or 122b shown in FIG. 1A. The patterned mask layer 310 is patterned or removed to form a trench exposing the conductive via 112 and the mask regions 306 that are uncovered by the mask region 316. The mask region 316 is left in place. The patterning or removal of the patterned mask layer 310 may be performed by wet etch, dry etch, an RIE, plasma etching, or other removing operations. A conductive material, such as copper, tungsten, aluminum, titanium, tantalum, titanium nitride, tantalum nitride, alloys thereof, or the like, is deposited in the trench and over the patterned dielectric layer 304 to form the conductive line 312. A planarization operation may be performed to level the upper surface of the conductive line 312. The conductive line 312 is electrically connected to the conductive via 112 accordingly.

Subsequently, a mask layer 314 is formed over the conductive line 312 and the mask region 316, as shown in FIG. 3J. The mask layer 314 is patterned to form a trench for exposing the mask region 316 directly above the gate-layer conductive line 108b. The material, configuration and method of forming for the patterned mask layer 314 are similar to those for the mask layer 310. A mask region 326 is formed in the trench defined by the patterned mask layer 314. The mask region 326 may be formed of a photoresist material or a dielectric material, such as oxide, nitride, oxynitride or carbide. In some embodiments, the mask region 326 includes a similar material to the mask region 306 or 316.

Referring to FIG. 3K, an etching operation is performed to remove the mask regions 306, 316 and 326 to form a trench 314A. The etching operation may include a dry etch, a wet etch, an RIE, plasma etch, or the like. In embodiments where a dry etch is used, a mask layer may be formed and patterned to expose the mask region 316 and used as etching mask during the etching operation. In some embodiments, the materials of the mask regions 306, 316 and 326 are chosen to be selective to an etchant relative to the materials of the dielectric layers 304 and 314 and the conductive line 312. In some embodiments, the etchant for the etching operation includes HF, $H_2SO_4$, $H_3PO_4$ or other suitable etchants. In some embodiments, the patterned dielectric layers 302 and 314 and the patterned conductive line 312 are kept substantially intact during the etching operation.

FIGS. 3L and 3M show the formation of the spacer layer 162. A spacer layer material 162D is conformally deposited on sidewalls and the bottom of the trench 314A and over the dielectric layer 314, as shown in FIG. 3L. The spacer layer material 162D may include a dielectric material, such as silicon oxide, silicon nitride, silicon oxynitride, silicon carbide, or a high-k dielectric material. In some embodiments, the spacer layer material 162D has a thickness DT in a range between about 1 nm and about 10 nm or between about 3 nm and about 7 nm. In some embodiments, a ratio of the thickness DT and a length GL of the gate electrode 104a is in a range between about 0.3 and about 3 or between about 0.7 and about 1.5. The spacer layer material 162D may be deposited using CVD, PVD, ALD, or other suitable deposition operations.

Referring to FIG. 3M, a patterning operation is performed to pattern the spacer layer material 162D such that only sidewalls of the spacer layer material 162D is left. The patterning operation may be performed by a dry etch operation. After the patterning operation, the spacer layer 162 is formed, wherein the upper surface of the spacer layer 162 is level with the upper surface of the dielectric layer 314.

A conductive material is deposited in the spaces of the trench 314A to form the conductive via (TPV) 114, as shown in FIG. 3N. The conductive material of the conductive via 114 may include copper, tungsten, aluminum, titanium, tantalum, titanium nitride, tantalum nitride, alloys thereof, or the like. In some embodiments, the material of the conductive via 114, which serves as a TPV, is the same as or different from that of the conductive via 112.

Referring to FIG. 3O, a dielectric layer 318 having the conductive line 134 is formed over the dielectric layer 314 and the conductive via 114. The materials, configurations and method of forming for the dielectric layer 318 and the conductive line 134 are similar to those of the dielectric layer 304 and the conductive via 112.

Similarly, a dielectric layer 320 having the conductive via 136 is formed over the dielectric layer 318 and the conductive line 134. A dielectric layer 322 having the conductive line 142 is formed over the dielectric layer 320 and the conductive via 136. The materials, configurations and method of forming for the dielectric layers 320, 322, the conductive via 136 and the conductive line 142 are similar to those of the dielectric layer 304 and the conductive via 112. An interconnect structure is formed between the conductive line 142 and the active region 102 through the gate-layer conductive line 108b, the TPV 114, the conductive line 134 and the conductive via 136.

The conductive via 116 serving as a TPV, as shown in FIGS. 1A and 1B, for electrically connecting the conductive line 134 to the gate electrode 104a or 104b is not shown in FIGS. 3H to 3O. However, the conductive via 116 can be formed using the methods similar to those for forming the conductive via 114 described with respect to FIG. 3H to 3O.

The dielectric layers 304, 314, 318, 320 and 322 are formed to encapsulate and insulate the conductive features therewithin, such as the conductive lines 312, 134 and 142 and the conductive vias 112 and 114, and are collectively referred to the intermetal dielectric (IMD). The component dielectric layers 304, 314, 318, 320 and 322 may be formed of the same or different dielectric materials and each may include a multilayer structure.

Figure 4A:
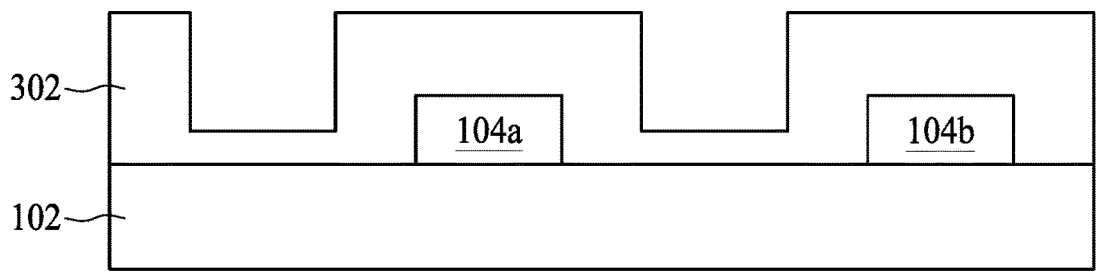
FIGS. 4A to 4Q are cross-sectional views of intermediate stages of a method of manufacturing a semiconductor device, in accordance with some embodiments of the present disclosure.
Figure 4B:
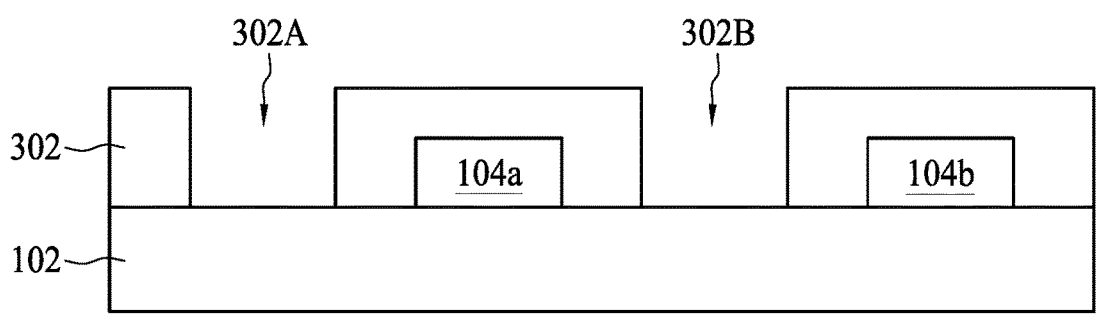
Figure 4C:
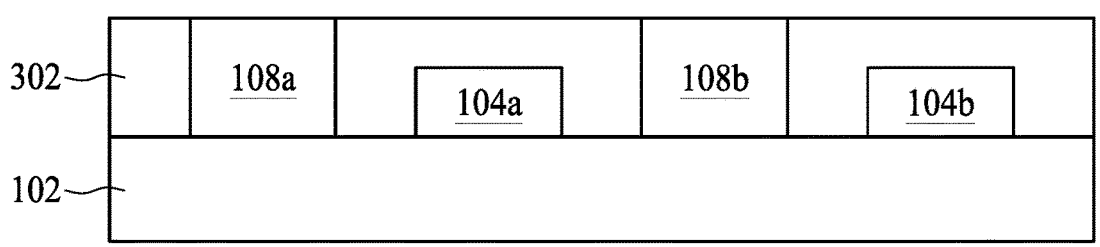
Figure 4D:
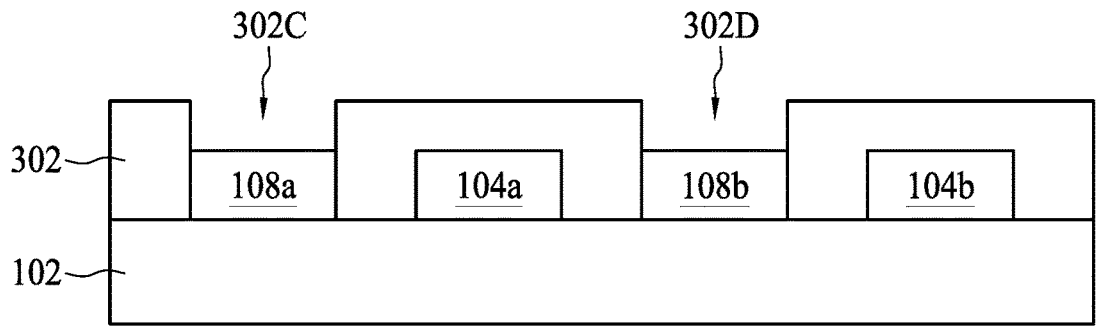
Figure 4E:
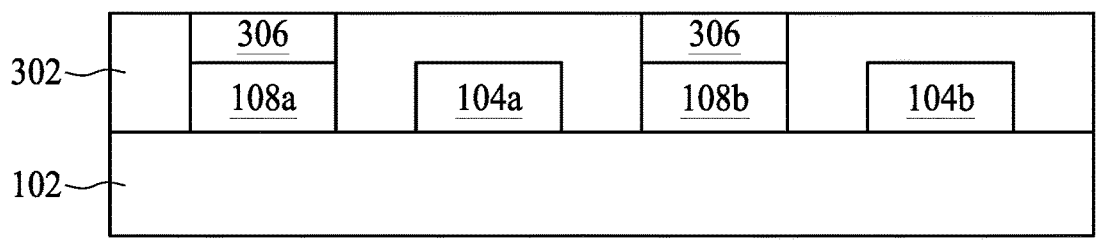
Figure 4F:
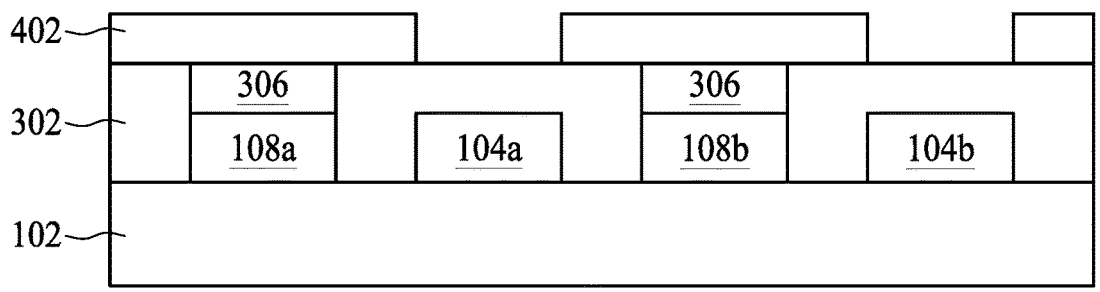
Figure 4G:
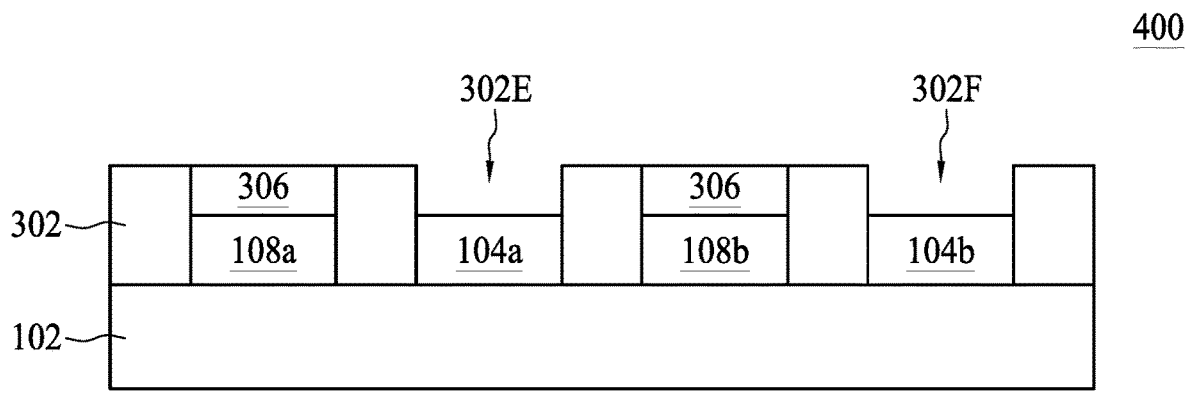
Figure 4H:
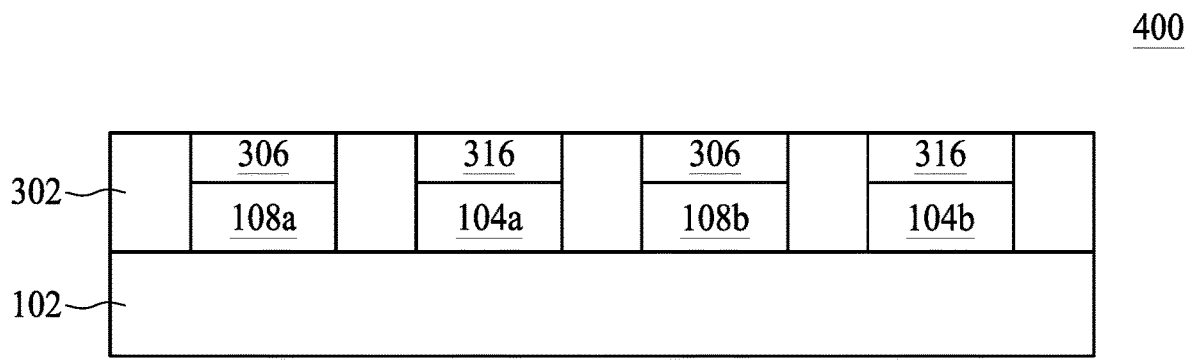
Figure 4I:
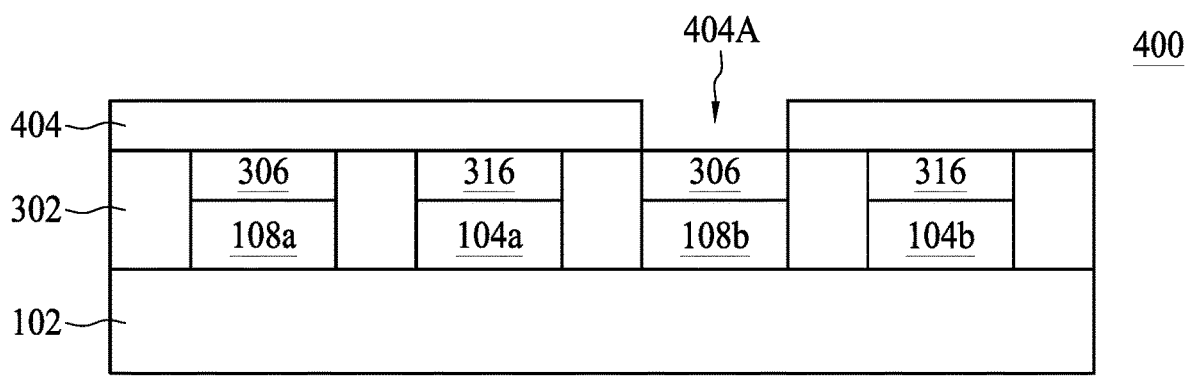
Figure 4J:
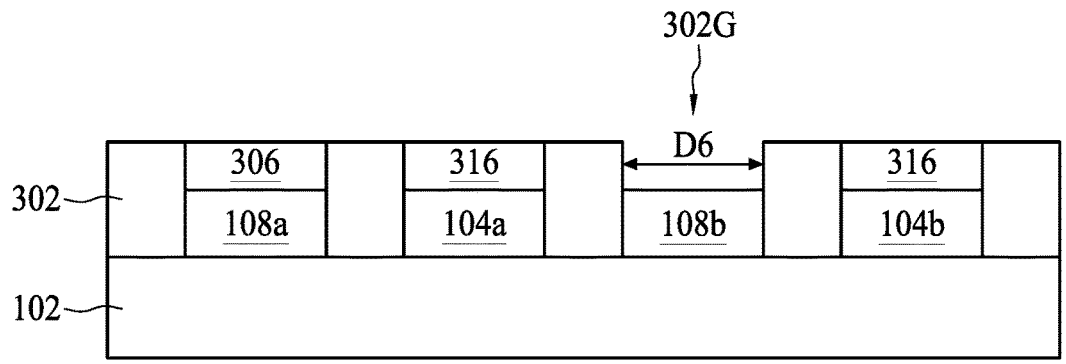
Figure 4K:
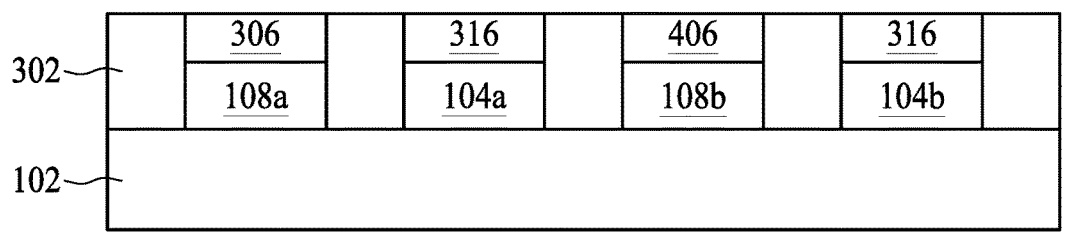
Figure 4L:
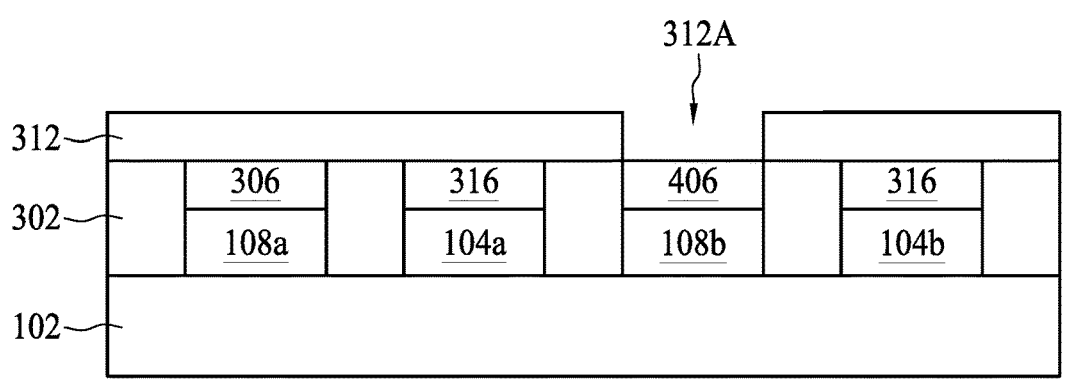
Figure 4M:
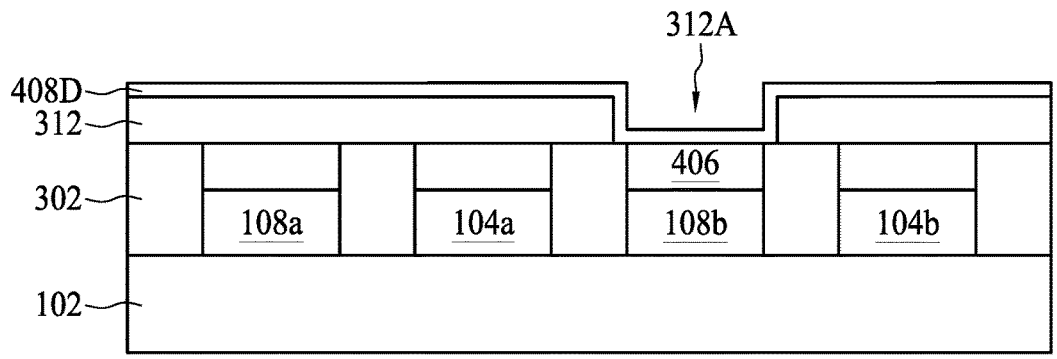
Figure 4N:
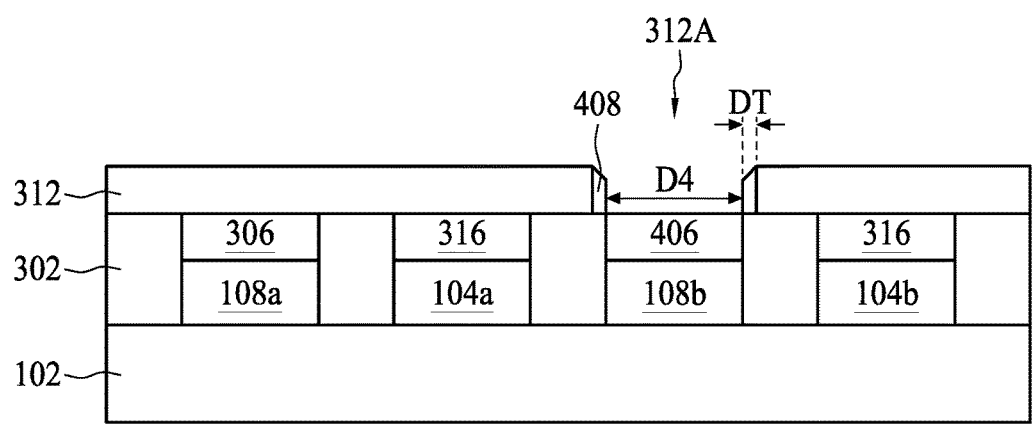
Figure 4O:
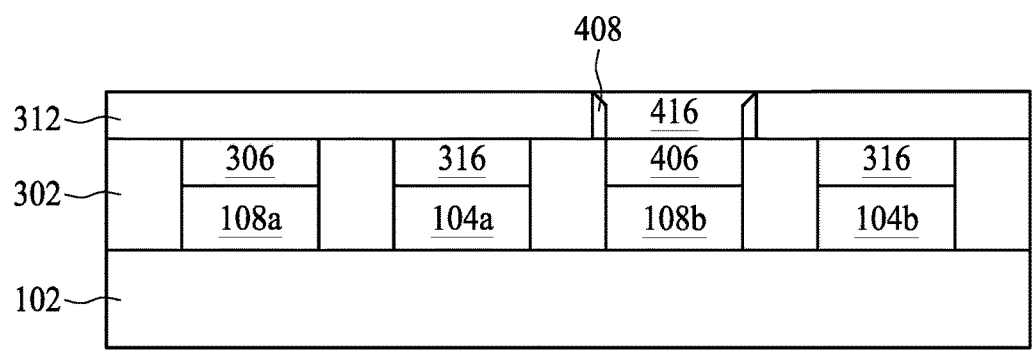
Figure 4P:
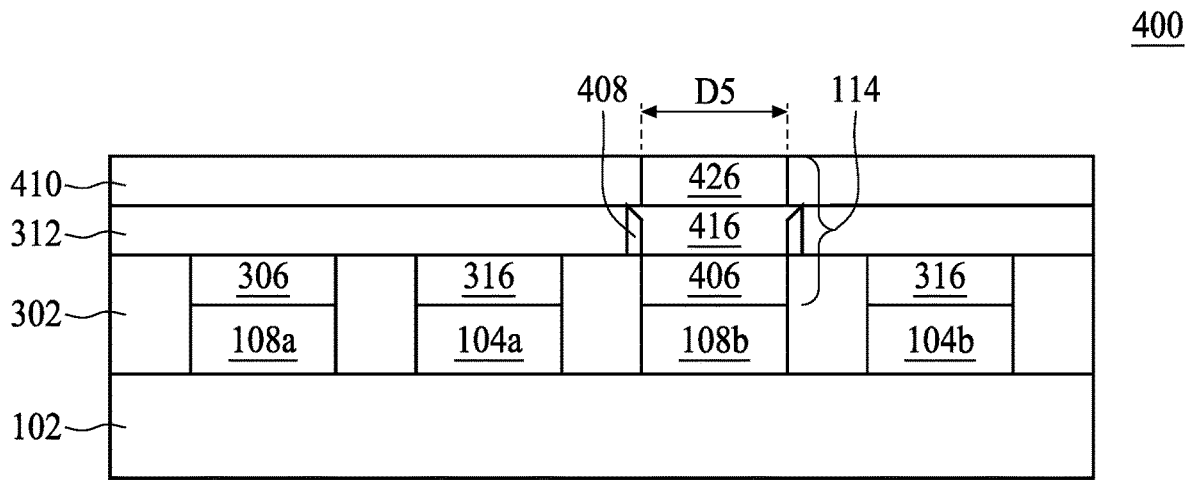
Figure 4Q:
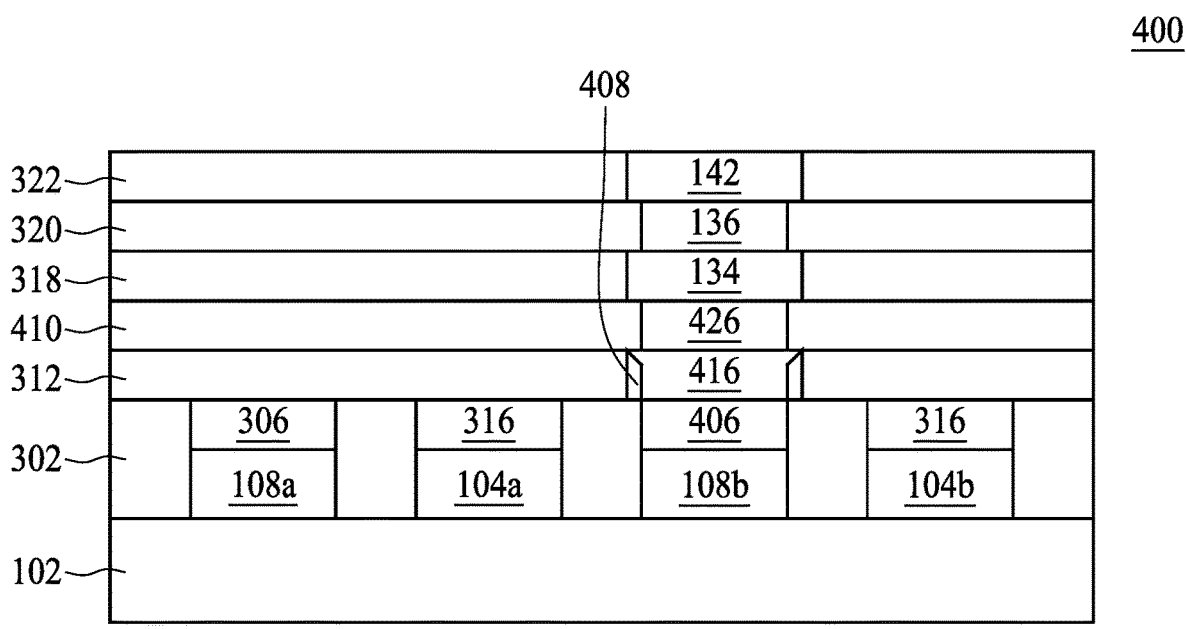

FIGS. 4A to 4Q are cross-sectional views of intermediate stages of a method of manufacturing a semiconductor device 400, in accordance with some embodiments of the present disclosure. The semiconductor device 400 is manufactured in accordance with the design layout of the cell 100A or 200A. It should be understood that additional steps can be provided before, during, and after the steps shown in FIGS. 4A to 4Q, and some of the steps described below can be replaced or eliminated in other embodiments. The order of the steps may be interchangeable. The configurations, dimensions, materials and formation methods of the features in FIGS. 4A to 4Q that are discussed with respect to the semiconductor device 300 are applicable to the present embodiment with reference to FIGS. 4A to 4Q.

Referring to FIG. 4A, the substrate including the active region 102 and the gate electrodes 104 is provided or formed, in a similar manner to those described with reference to FIG. 3A.

Referring to FIG. 4B, the dielectric layer 302 is patterned to form two exemplary trenches 302A and 302B for the gate-layer conductive lines 108, in a similar manner to those described with reference to FIG. 3B. The patterning of the dielectric layer 302 may be performed using photolithography and etching operations. The etching operation may be a dry etch, a wet etch, an RIE, or the like. During the patterning operation, the horizontal portions of the dielectric layer 302 over the gate electrodes 104 are kept intact from being removed.

Subsequently, gate-layer conductive lines 108a and 108b are deposited in the trenches 302A and 302B, as shown in FIG. 4C. The gate-layer conductive lines 108a and 108b may have upper surface level with the upper surface of the dielectric layer 302 and are higher than the gate electrodes 104.

Referring to FIG. 4D, an etching operation is performed to reduce a thickness of the deposited gate-layer conductive lines 108a and 108b. The etching operation may include a dry etch, a wet etch, an RIE, a plasma etch, or the like. In some embodiments, the etching operation causes the thinned gate-layer conductive lines 108a and 108b to have a height substantially equal to that of the gate electrodes 104. Two trenches 304C and 304D are formed above the gate-layer conductive lines 108a and 108b, respectively, after the etching operation is completed.

Subsequently, mask regions 306 are formed to fill the trenches 304C and 304D, as shown in FIG. 4E. The materials and method of forming the mask regions 306 shown in FIG. 4E is similar to that illustrated in FIG. 3E.

FIG. 4F to 4H show the formation of mask regions 316 in the dielectric layer 302. Referring to FIG. 4F, a mask layer 402 is formed and patterned over the dielectric layer 302. The mask layer 402 may be formed of a photoresist layer or a dielectric layer, such as oxide, nitride, oxynitride, or other dielectric materials. The dielectric layer 302 is then patterned to form trenches 302E and 302F using the mask layer 402 as an etching mask, as shown in FIG. 4G, where the trenches 302E and 303F exposes the underlying gate electrodes 104a and 104b, respectively. The patterning operation of the dielectric layer 302 is performed using an etching operation, such as a dry etch, a wet etch, RIE, or a plasma etch. The mask layer 402 may be removed or stripped after the patterning operation is completed.

Referring to FIG. 4H, the masked regions 316a and 316b are formed in the trenches 304E and 304F, respectively, in a manner similar to that forming the mask regions 306 as shown in FIG. 3E. The mask regions 316a and 316b are formed directly over the gate electrodes 104a and 104b, respectively.

FIGS. 4I to 4K illustrate the formation of a conductive via 406 to electrically connect to the gate-layer conductive line 108b. Referring to FIG. 4I, a mask layer 404 is formed over the dielectric layer 302. FIG. 4J shows that the mask layer 404 is patterned to form a trench 404A, in a manner similar to that forming the mask layer 402, to expose the mask region 306 over the gate-layer conductive line 108b. The exposed mask region 306 is etched using an etching operation with the mask layer 404 as an etching mask, as shown in FIG. 4J. A trench 302G having the width D6 is formed accordingly. The mask layer 404 may be stripped or removed after the trench 302G is formed. Subsequently, FIG. 4K shows that a conductive material is deposited in the trench 302G to form the conductive via 406 that is electrically connected to the gate-layer conductive line 108b. In some embodiments, a planarization is performed to level the upper surface of the conductive via 406.

Referring to FIG. 4L, the conductive line 312, which serves as a power rail, is deposited and patterned over the patterned dielectric layer 302. A trench 312A is formed to expose the conductive via 406.

Referring to FIG. 4M, a spacer layer material 408D is deposited over the dielectric layer 302 and on the sidewalls and the bottom of the trench 312A. The material and deposition method for the spacer layer material 408D is similar to those of the spacer layer material 162D described with reference to FIG. 3L. In some embodiments, the spacer layer material 408D has the thickness DT. Subsequently, a spacer layer 408 is formed by removing horizontal portions of the spacer layer material 408D using an etching operation, as shown in FIG. 4N. Once the spacer layer 408 is formed on the sidewalls of the trench 312A, the resultant trench 312A has the width D4. In some embodiments, the etching operation forms an angled or rounded corner at the top portion of the spacer layer 408, in which the angled or rounded corner facing the trench 312A.

FIG. 4O illustrates the formation of a conductive via 416 in the trench 312A. The material and formation method of the conductive via 416 are similar to those of the conductive via 406. Due to the presence of the angled or rounded corner of the spacer layer 408, the conductive via 416 includes a top surface and a bottom surface, in which the bottom surface having a width or area less than the width or area of the top surface.

Referring to FIG. 4P, a dielectric layer 410 having a conductive via 426 is formed over the conductive line 312. The conductive via 426 is electrically connected to the conductive via 416. The materials, configuration and formation methods of the dielectric layer 410 and the conductive via 426 are similar to those of the dielectric layer 318 and the conductive via 136 with reference to FIG. 3O. The conductive vias 406, 416 and 426 collectively from an effective TPV 114 running through and insulated from the conductive line 312, where the spacer layer 408 shown in FIG. 4P corresponds to the spacer layer 162 or 164 shown in FIG. 1D.

Referring to FIG. 4Q, the dielectric layer 318 having the conductive line 134 is formed over the dielectric layer 410 and the conductive via 114. Similarly, the dielectric layer 320 having the conductive via 136 is formed over the dielectric layer 318 and the conductive line 134. The dielectric layer 322 having the conductive line 142 is formed over the dielectric layer 320 and the conductive via 136.

FIGS. 5A to 5E are cross-sectional views of intermediate stages of a method of manufacturing a semiconductor device 500, in accordance with some embodiments of the present disclosure. The semiconductor device 500 is manufactured in accordance with the design layout of the cell 100A or 200A. It should be understood that additional steps can be provided before, during, and after the steps shown in FIGS. 5A to 5E, and some of the steps described below can be replaced or eliminated in other embodiments. The order of the steps may be interchangeable. The configurations, dimensions, materials and formation methods of the features in FIGS. 5A to 5E that are discussed with respect to the semiconductor device 300 or 400 are applicable to the present embodiment with reference to FIGS. 5A to 5E.

FIGS. 5A to 5E are alternative steps to the steps shown in FIGS. 4L to 4O of forming the semiconductor device 400. In continuation with the processing step shown in FIG. 4K, referring to FIG. 5A, a mask layer 510 is formed over the dielectric layer 312, The mask layer 510 is patterned to form a trench (not explicitly shown) exposing the conductive via 406, in a similar manner to that forming the mask layer 402 with reference to FIG. 4F. The conductive via 416 is subsequently deposited in the trench.

Figure 5A:
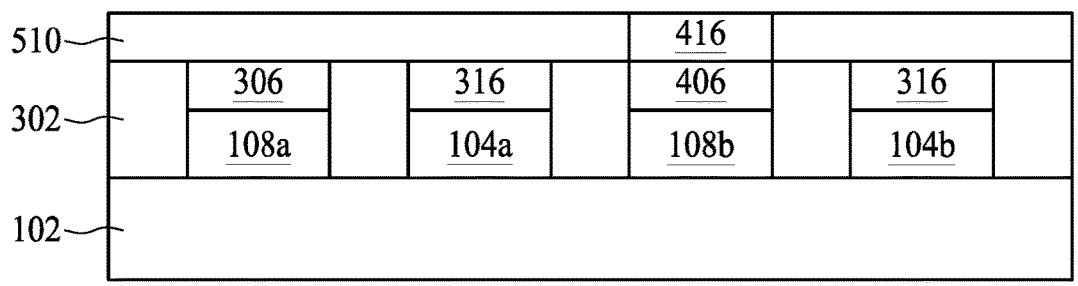
FIGS. 5A to 5E are cross-sectional views of intermediate stages of a method of manufacturing a semiconductor device, in accordance with some embodiments of the present disclosure.
Figure 5B:
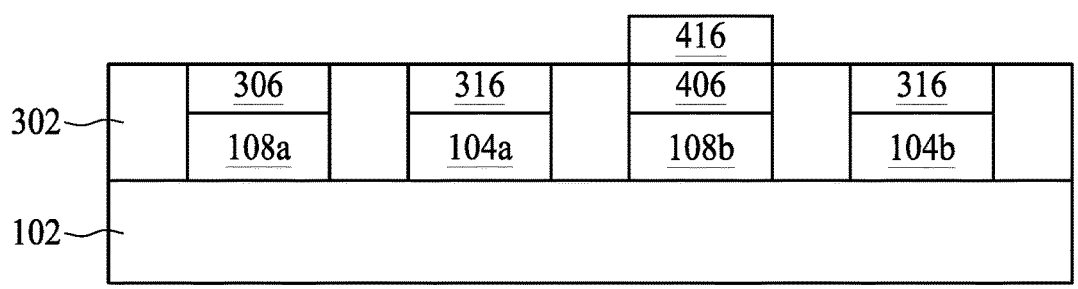

Referring to FIG. 5B, the mask layer 510 is removed or stripped off after the conductive via 416 is formed. The upper surface of the dielectric layer 302 is exposed.

Figure 5C:
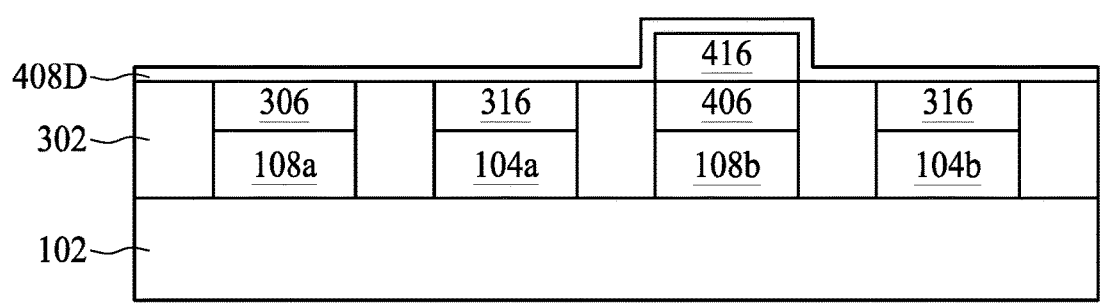
Figure 5D:
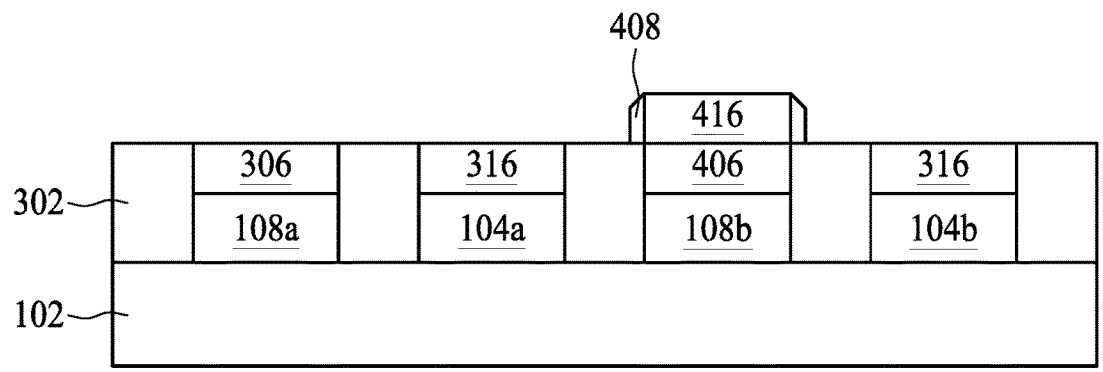

Referring to FIG. 5C, the spacer layer material 408D is conformally deposited over the dielectric layer 302 and the conductive via 416. Subsequently, an etching operation is performed on the spacer layer material 408D to form the spacer layer 408 on the sidewalls of the conductive via 416, as shown in FIG. 5D. The material and formation method for the spacer layer 408 shown in FIGS. 5C and 5D are similar to those discussed withe reference to FIGS. 4M and 4N. In some embodiments, the etching operation forms an angled or rounded corner of the spacer layer 408 at the top portion, in which the angled or round corner faces away from the conductive via 416.

Figure 5E:
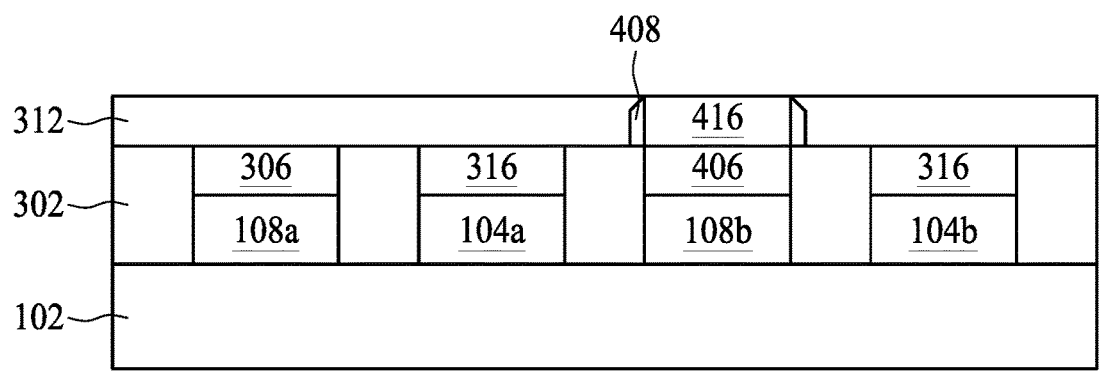

Referring to FIG. 5E, the conductive line 312 is formed over the dielectric layer 302 and laterally surrounding the spacer layer 408. The forming of the conductive line 312 may include a deposition operation and a planarization operation to level the upper surface of the conductive line 312 with the upper surface of the conductive via 416. In some embodiments, the width of the conductive via 416 may be substantially equal through the height of the conductive via 416.

Figure 6A:
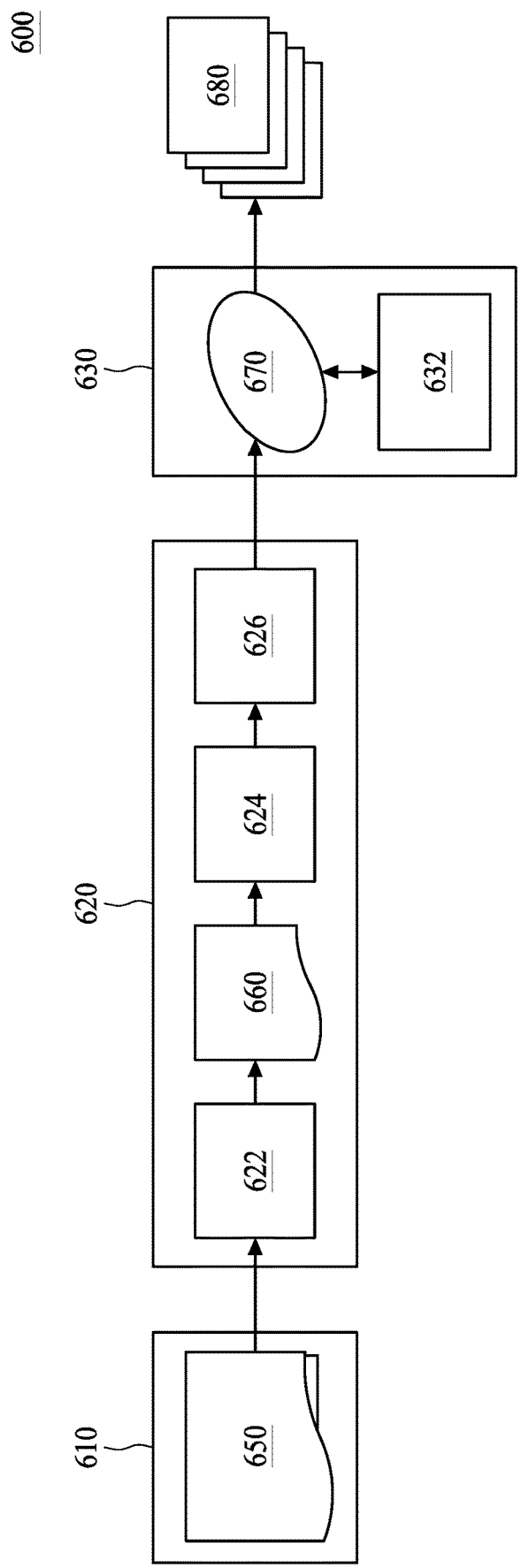
FIG. 6A is a schematic diagram showing an integrated circuit (IC) manufacturing system, in accordance with some embodiments.

FIG. 6A is a schematic diagram showing an integrated circuit (IC) manufacturing system 600, in accordance with some embodiments. The IC manufacturing system 600 is configured to manufacture an IC device 680 through a plurality of entities, such as a design subsystem 610, a mask subsystem 620, and a fabrication subsystem 630. The entities in the IC manufacturing system 600 may be linked by a communication channel, e.g., a wired or wireless channel, and interact with one another through a network, e.g., an intranet or the internet. In an embodiment, the design subsystem 610, the mask subsystem 620 and the fabrication subsystem 630 belong to a single entity, or are operated by independent parties.

The design subsystem (design house or layout design provider) 610 generates a design layout 650 in a design phase for the IC devices 680 to be fabricated. The design subsystem 610 may perform the layout methods discussed in the present disclosure to generate the design layout 650, e.g., the design layouts shown with reference to the figures of the present disclosure. In an embodiment, the design subsystem 610 operates a circuit design procedure to generate the design layout 650. The design subsystem 610 may include further one or more steps, such as logic design, physical design, pre-layout simulation, placement and routing, timing analysis, parameter extraction, design rule check and post-layout simulation, to generate the design layout 650. The design layout 650 may be converted from description texts into their visual equivalents to show a physical layout of the depicted patterns, such as the dimensions, shapes and locations thereof. In an embodiment, the design layout 650 can be expressed in a suitable file format such as GDSII, DFII, OASIS, or the like.

The mask subsystem 620 receives the design layout 650 from the design subsystem 610 and manufactures one or more masks (photomask, lithography masks or reticles) according to the design layout 650. In an embodiment, the mask subsystem 620 includes a mask data preparation block 622, a mask fabrication block 624 and a mask inspection block 626. The mask data preparation block 622 modifies the design layout 650 so that a revised design layout 660 can allow a mask writer to transfer the design layout 650 to a writer-readable format.

The mask fabrication block 624 is configured to fabricate the mask by preparing a substrate based on the design layout 660 provided by the mask data preparation block 622. A mask substrate is exposed to a radiation beam, such as an electron beam, based on the pattern of the design layout 660 in a writing operation, which may be followed by an etching operation to leave behind the patterns corresponding to the design layout 660. In an embodiment, the mask fabrication block 624 includes a checking procedure to ensure that the layout data 660 complies with requirements of a mask writer and/or a mask manufacturer to generate the mask as desired. An electron-beam (e-beam), multiple e-beams, an ion beam, a laser beam or other suitable writer source may be used to transfer the patterns.

After the lithography mask is fabricated, the mask inspection block 626 inspects the fabricated mask to determine if any defects, such as full-height and non-full-height defects, exist in the fabricated mask. If any defects are detected, the mask may be cleaned or the design layout in the mask may be modified.

The fabrication subsystem 630 is an IC manufacturing entity that includes multiple manufacturing facilities or tools for the fabrication of a variety of the IC devices 680. The fabrication subsystem 630 uses the mask fabricated by the mask subsystem 620 to fabricate a wafer 670 having a plurality of IC devices 680 thereon. The wafer 670 includes a semiconductor substrate and optionally various layers formed thereon. The operations provided by the manufacturing facilities or tools may include, but not limited to, photolithography, deposition, sputtering, etching, diffusion, ion implantation and annealing. In some embodiments, test structures may be formed on the wafer 670 to generate test data indicative of the quality of the fabricated wafer 670. In an embodiment, the fabrication subsystem 630 includes a wafer testing block 632 configured to ensure that the wafer 670 conforms to physical manufacturing specifications and mechanical and/or electrical performance specifications. After the wafer 670 passes the testing procedure performed by the wafer testing block 632, the wafer 670 may be diced (or sliced) along the scribe line regions to form separate IC devices 680. The dicing process can be accomplished by scribing and breaking, by mechanical sawing (e.g., with a dicing saw) or by laser cutting.

Figure 6B:
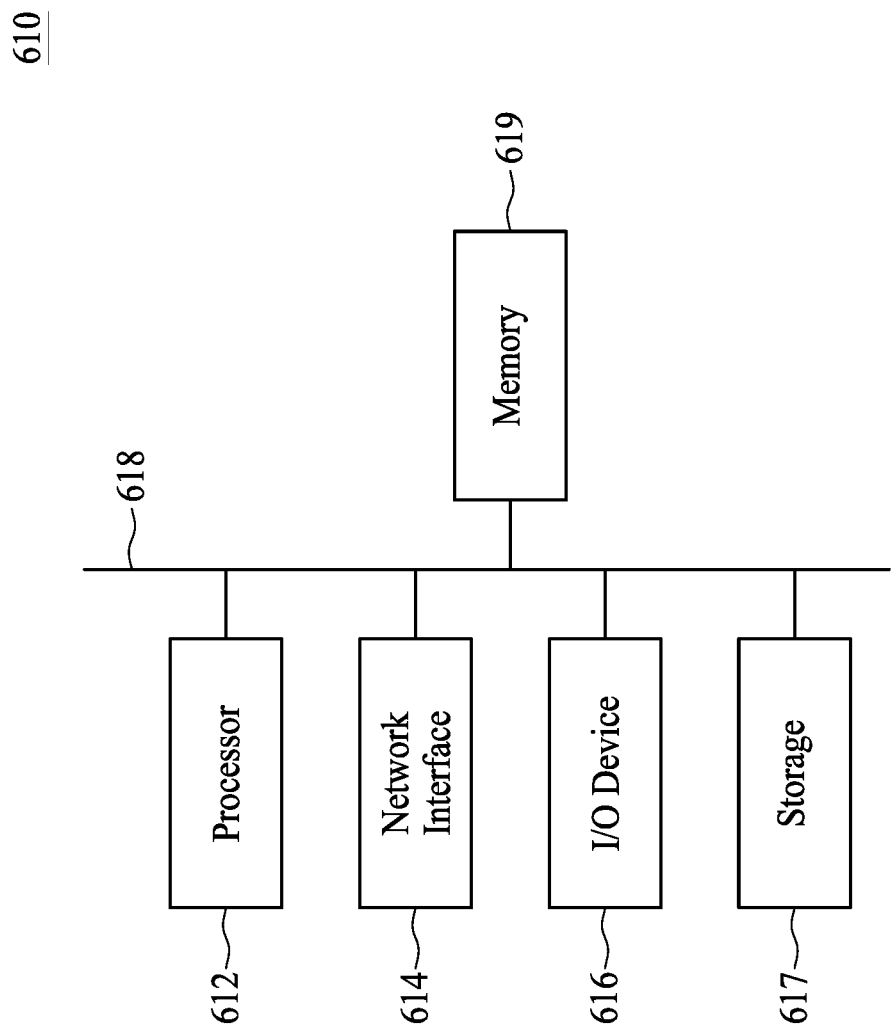
FIG. 6B is a schematic diagram of a design subsystem in the IC manufacturing system shown in FIG. 6A for generating a design layout, in accordance with some embodiments.

FIG. 6B is a schematic diagram of the design subsystem 610 of the IC manufacturing system 600 shown in FIG. 6A for generating or storing the design layouts 650 discussed above, in accordance with some embodiments. In some embodiments, the design subsystem 610 is a computer system. The design subsystem 610 includes a processor 66, a network interface 614, an input and output (I/O) device 616, a storage device 617, a memory 619, and a bus 618. The bus 618 couples the network interface 614, the I/O device 616, the storage device 617, the memory 619 and the processor 66 to each other.

The processor 66 is configured to execute program instructions that include a tool configured to generate the design layouts as described and illustrated with reference to figures of the present disclosure.

The network interface 614 is configured to access program instructions and data accessed by the program instructions stored remotely through a network (not shown).

The I/O device 616 includes an input device and an output device configured for enabling user interaction with the circuit design subsystem 610. In some embodiments, the input device includes, for example, a keyboard, a mouse, and other devices. Moreover, the output device includes, for example, a display, a printer, and other devices.

The storage device 617 is configured for storing the design layouts, program instructions and data accessed by the program instructions. In some embodiments, the storage device 617 includes a cell library for storing the data of the cells as discussed in the present disclosure. In some embodiments, the storage device 617 includes a non-transitory computer-readable storage medium, for example, a magnetic disk and an optical disk.

The memory 619 is configured to store program instructions to be executed by the processor 66 and data accessed by the program instructions. In some embodiments, the memory 619 includes any combination of a random-access memory (RAM), some other volatile storage device, a read-only memory (ROM), and some other non-volatile storage device.

According to an embodiment, a semiconductor device includes a gate electrode extending in a first direction in a first layer over an active region, a first conductive line extending in the first layer adjacent to the gate electrode, a first power rail extending in a second direction perpendicular to the first direction in a second layer over the first layer, a second conductive line arranged in a third layer over the second layer, and a conductive via extending through the first power rail and electrically connecting the second conductive line to one of the gate electrode and the first conductive line. The conductive via is electrically insulated from the first power rail.

According to an embodiment, a semiconductor device includes a gate electrode extending in a first direction in a first layer over an active region, a first conductive line extending in the first layer adjacent to the gate electrode, and a first power rail arranged in a second layer over the first layer. The second layer is configured as a power layer. The semiconductor device also includes a second conductive line arranged in a third layer over the second layer, and a first conductive via electrically extending through the first power rail and electrically connecting the second conductive line to the first conductive line. The first conductive via is electrically insulated from the first power rail.

According to an embodiment, a method of manufacturing a semiconductor device includes: forming an active region and a gate electrode in a first layer; forming a first conductive line extending in a first direction in the first layer over one of the active region and the gate electrode; depositing a first dielectric layer in a second layer over the first layer; forming a second conductive line over the first dielectric layer; depositing a second dielectric layer over the second conductive line; forming a via through the second dielectric layer, the second conductive line and the first dielectric layer to expose the first conductive line: lining a spacer layer to a sidewall of the via; forming a conductive via in the via and electrically coupled to the first conductive line; and forming a third conductive line over the second dielectric layer and electrically coupled to the conductive via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a gate electrode extending in a first direction in a first layer over an active region;
   a first conductive line extending in the first layer adjacent to the gate electrode;
   a first power rail extending in a second direction perpendicular to the first direction in a second layer over the first layer;
   a second conductive line arranged in a third layer over the second layer; and
   a conductive via extending through the first power rail and electrically connecting the second conductive line to one of the gate electrode and the first conductive line, wherein the conductive via is electrically insulated from the first power rail.

2. The semiconductor device according to claim 1, further comprising a spacer layer electrically insulating the conductive via from the first power rail.

3. The semiconductor device according to claim 2, wherein the spacer layer extends from the first conductive line to the second conductive line.

4. The semiconductor device according to claim 2, wherein the spacer layer is at least partially laterally surrounded by the first power rail.

5. The semiconductor device according to claim 1, further comprising a second power rail arranged in the second layer and parallel to the first power rail.

6. The semiconductor device according to claim 5, wherein the second power rail is immediately adjacent to the first power rail.

7. The semiconductor device according to claim 1, further comprising a third power rail arranged in the third layer and parallel to the second conductive line, wherein the third power rail is electrically coupled to the first power rail.

8. The semiconductor device according to claim 7, wherein the third power rail is aligned with the second conductive line in the second direction.

9. The semiconductor device according to claim 7, wherein the third power rail has a first width measured in the first direction, and the first power rail has a second width, measured in the first direction, greater than the first width.

10. The semiconductor device according to claim 1, wherein the second layer is configured as a power layer.

11. A semiconductor device, comprising:
- a gate electrode extending in a first direction in a first layer over an active region;
- a first conductive line extending in the first layer adjacent to the gate electrode;
- a first power rail arranged in a second layer over the first layer, wherein the second layer is configured as a power layer;
- a second conductive line arranged in a third layer over the second layer; and
- a first conductive via extending through the first power rail and electrically connecting the second conductive line to the first conductive line, wherein the first conductive via is electrically insulated from the first power rail.

12. The semiconductor device according to claim 11, further comprising a first dielectric layer electrically insulating the first conductive via from the first power rail.

13. The semiconductor device according to claim 12, wherein the first dielectric layer has a height equal to a thickness of the first power rail from a cross-sectional view.

14. The semiconductor device according to claim 11, further comprising a third conductive line arranged in the third layer and a second conductive via extending through the first power rail and electrically connecting the gate electrode to the third conductive line.

15. The semiconductor device according to claim 11, further comprising a second power rail arranged in the third layer and parallel to the second conductive line.

16. The semiconductor device according to claim 15, wherein the second power rail is shorter than the first power rail in the first direction.

17. The semiconductor device according to claim 11, further comprising a second dielectric layer interfacing the first layer and the second layer and a second conductive via laterally surrounded by the second dielectric layer, wherein the second conductive via electrically connects the first power rail to one of the first conductive line and the gate electrode.

18. A semiconductor device, comprising:
- a gate electrode extending in a first direction in a first layer over an active region;
- a first conductive line extending in the first layer adjacent to the gate electrode;
- a first power rail extending in a second direction perpendicular to the first direction in a second layer over the first layer;
- a second conductive line arranged in a third layer over the second layer, the second conductive line extending in the second direction; and
- a conductive via extending through and separated from the first power rail and electrically connecting the second conductive line to one of the gate electrode and the first conductive line.

19. The semiconductor device of claim 18, wherein the conductive via is electrically insulated from the first power rail.

20. The semiconductor device of claim 18, wherein the first power rail has a first width greater than a second width of the second conductive line.

* * * * *